United States Patent
Okino et al.

(10) Patent No.: US 10,837,896 B2
(45) Date of Patent: Nov. 17, 2020

(54) ELECTRONIC PREPARED SLIDE, SOLID STATE IMAGING ELEMENT, AND ELECTRONIC PREPARED SLIDE ASSEMBLY METHOD

(71) Applicant: PANASONIC INTELLECTUAL PROPERTY MANAGEMENT CO., LTD., Osaka (JP)

(72) Inventors: Toru Okino, Osaka (JP); Shota Yamada, Shiga (JP); Yutaka Hirose, Kyoto (JP); Yoshihisa Kato, Hyogo (JP); Tsuyoshi Tanaka, Osaka (JP); Manabu Kamoshida, Kanagawa (JP); Hideto Motomura, Kyoto (JP); Yoshihide Sawada, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 820 days.

(21) Appl. No.: 15/589,661

(22) Filed: May 8, 2017

(65) Prior Publication Data
US 2017/0241898 A1    Aug. 24, 2017

Related U.S. Application Data

(63) Continuation of application No. PCT/JP2015/005538, filed on Nov. 5, 2015.

(30) Foreign Application Priority Data

Nov. 25, 2014    (JP) .................................. 2014-237749
Jan. 29, 2015    (JP) .................................. 2015-016096

(51) Int. Cl.
| G01N 21/01 | (2006.01) |
| G01N 21/84 | (2006.01) |
| H01L 27/146 | (2006.01) |

(52) U.S. Cl.
CPC ............. *G01N 21/01* (2013.01); *G01N 21/84* (2013.01); *H01L 27/14603* (2013.01); *H01L 27/14636* (2013.01)

(58) Field of Classification Search
CPC .. G01N 21/01; G01N 21/84; H01L 27/14603; H01L 27/1462; H01L 27/14625; H01L 27/14636
(Continued)

(56) References Cited

U.S. PATENT DOCUMENTS

| 4,678,913 A | 7/1987 | Dodd, Jr. et al. |
| 5,307,161 A | 4/1994 | Miyamoto |

(Continued)

FOREIGN PATENT DOCUMENTS

| JP | 04-316478 A | 11/1992 |
| JP | 2002-202303 A | 7/2002 |

(Continued)

OTHER PUBLICATIONS

Office Action with Search Report issued in Chinese patent application No. 201580061511.7, dated Jul. 3, 2019; with English translation.
(Continued)

*Primary Examiner* — Kevin K Pyo
(74) *Attorney, Agent, or Firm* — McDermott Will & Emery LLP

(57) ABSTRACT

An electronic prepared slide includes: an image sensor that has a light receiving surface and receives, on the light receiving surface, light that has passed through a specimen disposed above the light receiving surface; and a removable nonvolatile transparent film that is disposed on the light receiving surface and seals the light receiving surface.

14 Claims, 15 Drawing Sheets

(58) Field of Classification Search
USPC .............................................. 250/208.1, 216
See application file for complete search history.

(56) References Cited

U.S. PATENT DOCUMENTS

| | | |
|---|---|---|
| 2002/0081716 A1 | 6/2002 | Yagi |
| 2008/0259444 A1* | 10/2008 | Smith ................ G02B 21/0008 359/385 |
| 2010/0323926 A1 | 12/2010 | Lee et al. |
| 2014/0291492 A1 | 10/2014 | Kusaka |

FOREIGN PATENT DOCUMENTS

| | | |
|---|---|---|
| JP | 2002-351802 A | 12/2005 |
| JP | 2010-533860 A | 10/2010 |
| JP | 2014-209088 A | 11/2014 |

OTHER PUBLICATIONS

International Search Report and Written Opinion issued in International Patent Application No. PCT/JP2015/005538, dated Jan. 26, 2016; with English translation.

* cited by examiner

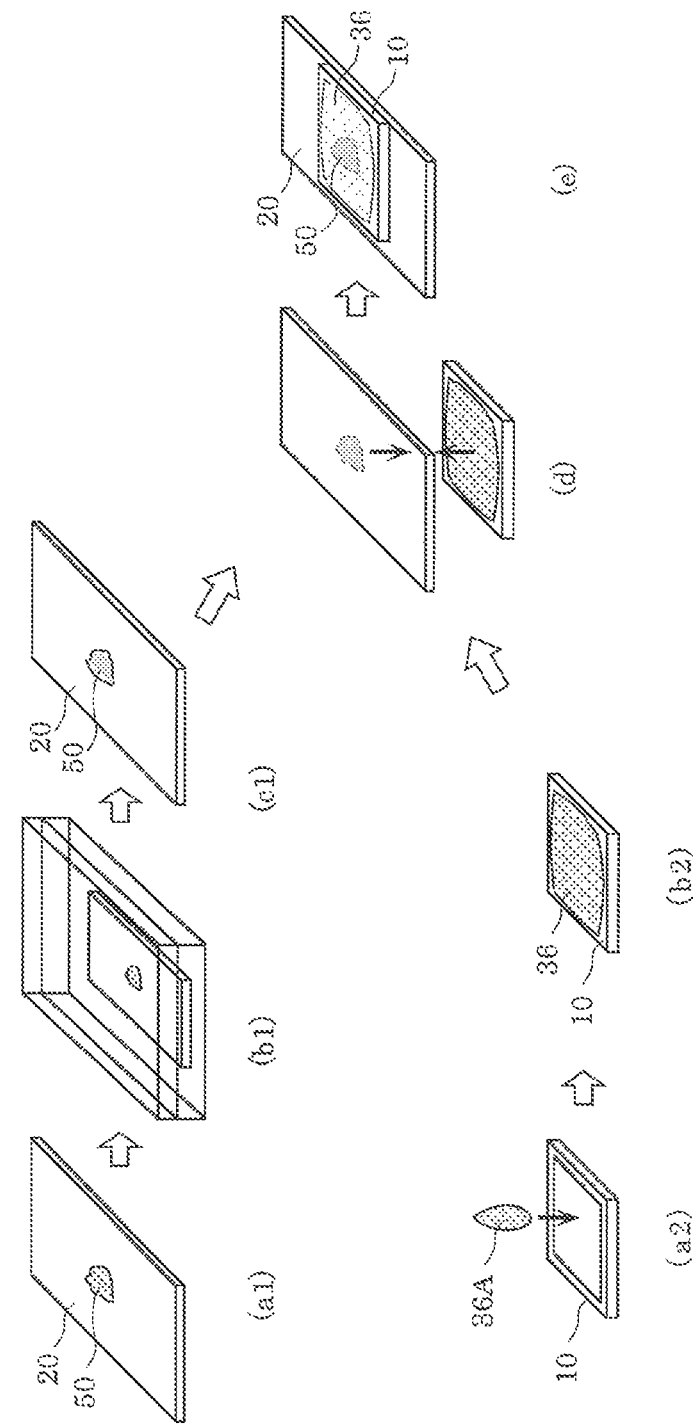

ELECTRONIC PREPARED SLIDE, SOLID STATE IMAGING ELEMENT, AND ELECTRONIC PREPARED SLIDE ASSEMBLY METHOD

CROSS REFERENCE TO RELATED APPLICATIONS

This application is a U.S. continuation application of PCT International Patent Application Number PCT/JP2015/005538 filed on Nov. 5, 2015, claiming the benefit of priority of Japanese Patent Application Numbers 2014-237749 filed on Nov. 25, 2014 and 2015-016096 filed on Jan. 29, 2015, the entire contents of which are hereby incorporated by reference.

BACKGROUND

1. Technical Field

The present disclosure relates to an electronic prepared slide, a solid state imaging element, and an electronic prepared slide assembly method.

2. Description of the Related Art

Pathological diagnosis in which a disease is diagnosed from tissue (specimen) obtained directly from an affected area of a patient is a very effective technique for identifying the name of the disease and the progress of the disease. For such pathological diagnosis, microscopic imaging is performed on a large number of specimens in a hospital or laboratory.

Japanese Unexamined Patent Application Publication No. H4-316478 discloses a biological specimen observation apparatus including a solid state imaging element on which a specimen is placed on its light receiving surface and a holder that fixes the solid state imaging element and the specimen. The microstructure of the specimen is captured by imaging the light that has passed through the specimen on the light receiving surface of the solid state imaging element. The above configuration eliminates the need to dispose an optical system between the specimen and the solid state imaging element, and thus the observation apparatus can be simplified significantly.

With the conventional technique disclosed in Japanese Unexamined Patent Application Publication No. 114-316478, however, the specimen is placed directly on the light receiving surface of the solid state imaging element, and for this reason, the light receiving surface may be damaged. From the viewpoint of the cost and the accuracy of images imaged by the solid state imaging element, it is advantageous to image a plurality of specimens by using one solid state imaging element, but if the solid state imaging element is attached to the specimen each time the specimen is replaced with a different one, the damage on the light receiving surface progresses, and as a result, the image accuracy decreases.

In view of the problem described above, the present disclosure provides an electronic prepared slide, a solid state imaging element, and an electronic prepared slide assembly method that provide a high level of image accuracy at a low cost.

SUMMARY

In order to solve the problem described above, an electronic prepared slide according to one aspect of the present disclosure includes: a solid state imaging element that has a light receiving surface and receives, on the light receiving surface, light that has passed through a specimen disposed above the light receiving surface; and a transparent member that is removable and nonvolatile and is disposed on the light receiving surface to seal the light receiving surface.

Also, a solid state imaging element according to one aspect of the present disclosure is a solid state imaging element that receives light that has passed through an object to be imaged, the solid state imaging element including: a light receiving surface that contacts a transparent member that is removable and nonvolatile at a surface of the transparent member that is on an opposite side to a surface of the transparent member that opposes the object to be imaged; and a plurality of pixels disposed in a matrix on the light receiving surface.

Also, an electronic prepared slide assembly method according to one aspect of the present disclosure is an electronic prepared slide assembly method for assembling an electronic prepared slide in which a specimen and a solid state imaging element that images the specimen are fixedly disposed, the method including: preparing the specimen; disposing a transparent member between the specimen and a light receiving surface of the solid state imaging element so as to be in contact with the light receiving surface of the solid state imaging element, the transparent member being removable and nonvolatile; and detachably fixing the specimen and the solid state imaging element.

With the electronic prepared slide, the solid state imaging element, or the electronic prepared slide assembly method according to the present disclosure, because a nonvolatile transparent member is interposed between the light receiving surface of the solid state imaging element and the specimen, it is possible to prevent the solid state imaging element from being damaged. Accordingly, it is possible to acquire data of observed specimen having a high level of image accuracy at a low cost.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 15 is a process chart illustrating a method for forming a prepared slide and an image sensor according to Embodiment 3;

DETAILED DESCRIPTION OF THE EMBODIMENTS

Hereinafter, an electronic prepared slide, a solid state imaging element, an electronic prepared slide assembly set, and an electronic prepared slide assembly method according to embodiments of the disclosure will be described with reference to the drawings. Note that the embodiments given below show specific examples of the present disclosure, and the numerical values, shapes, materials, structural elements, the arrangement and connection of the structural elements, steps, the order of the steps, and the like are merely examples, and therefore do not limit the scope of the present disclosure.

Embodiment 1

[1. Configuration of Electronic Prepared Slide]

Figure 1:
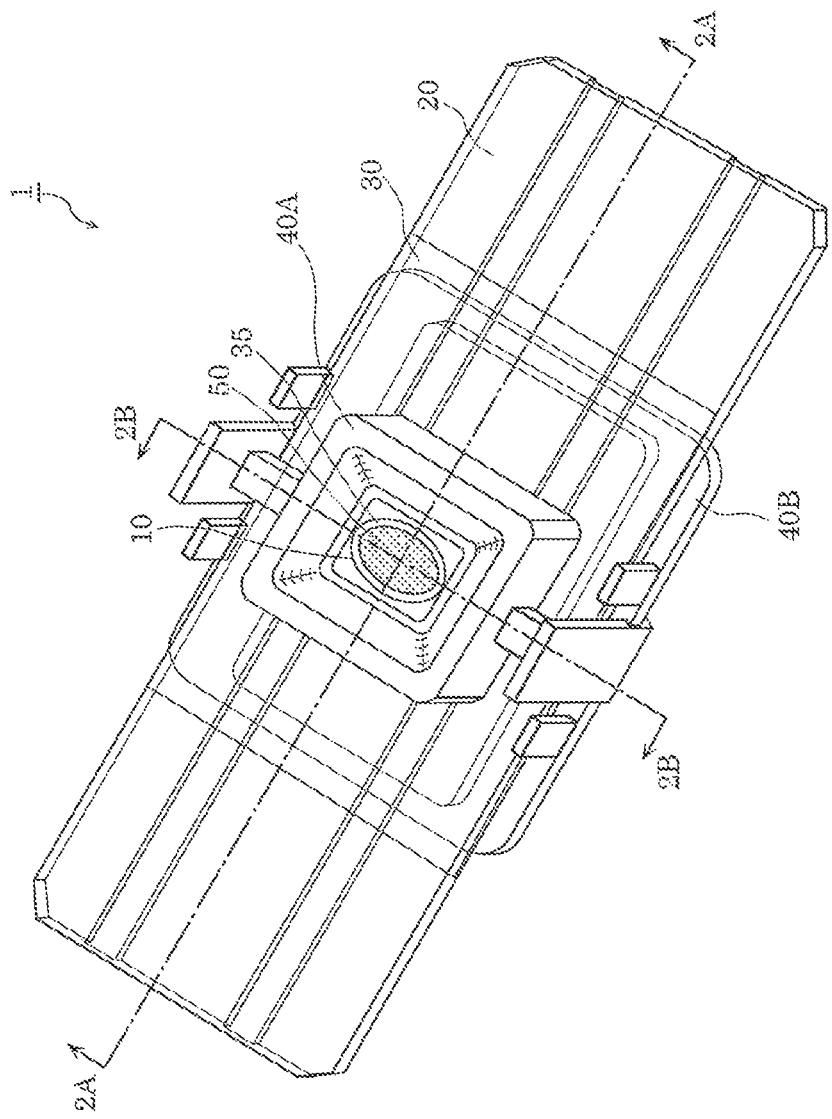
FIG. 1 is an external perspective view of an electronic prepared slide according to Embodiment 1.
Figure 2A:
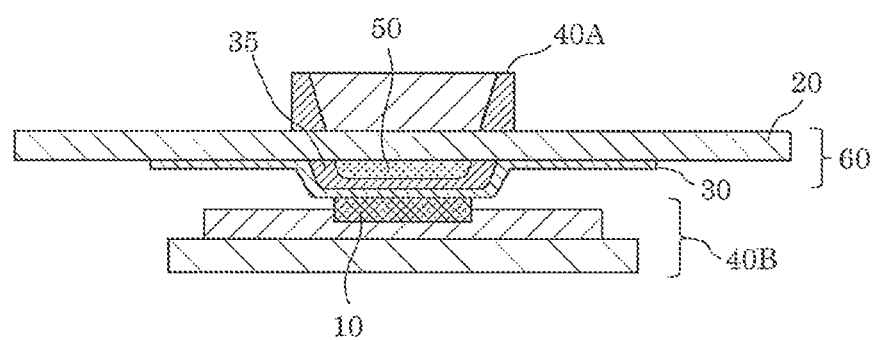
FIG. 2A is a first cross-sectional view of an electronic prepared slide according to Embodiment 1.
Figure 2B:
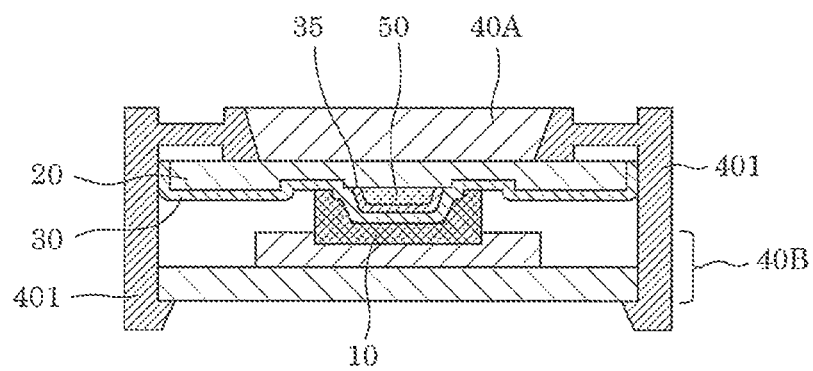
FIG. 2B is a second cross-sectional view of the electronic prepared slide according to Embodiment 1.

FIG. 1 is an external perspective view of an electronic prepared slide according to Embodiment 1. FIG. 2A is a first cross-sectional view of the electronic prepared slide according to Embodiment 1, and FIG. 2B is a second cross-sectional view of the electronic prepared slide according to Embodiment 1. To be specific, FIG. 2A is a cross-sectional view taken along the line 2A-2A shown in FIG. 1, and FIG. 2B is a cross-sectional view taken along the line 2B-2B shown in FIG. 1.

In the present embodiment, "electronic prepared slide" refers to, for example, a slide including at least a specimen (an object to be imaged or a pathological specimen) and an electronic component (an integrated circuit or a semiconductor chip) such as a solid state imaging element, or a slide obtained by placing a specimen (an object to be imaged or a pathological specimen) on a transparent substrate and sandwiching the specimen between the transparent substrate and an electronic component (an integrated circuit or a semiconductor chip) such as a solid state imaging element.

As shown in FIGS. 1, 2A and 2B, electronic prepared slide 1 according to the present embodiment includes image sensor (solid state imaging element) 10, glass slide 20, transparent film 30, encapsulating member 35, and base members 40A and 40B. Glass slide 20, transparent film 30, encapsulating member 35 and specimen 50 constitute a prepared slide. Also, base members 40A and 40B constitute a fixing member. Hereinafter, the constituent elements of electronic prepared slide 1 will be described.

[1-1. Configuration of Prepared Slide]

Figure 3A:
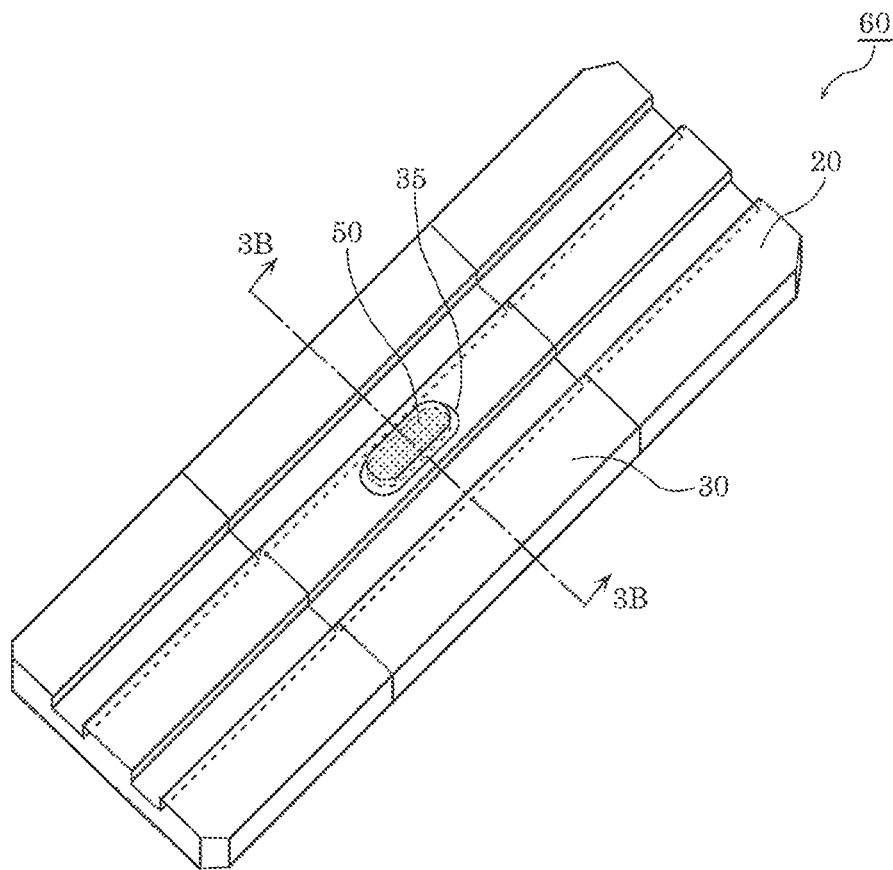
FIG. 3A is a schematic configuration diagram of a prepared slide according to Embodiment 1.
Figure 3B:
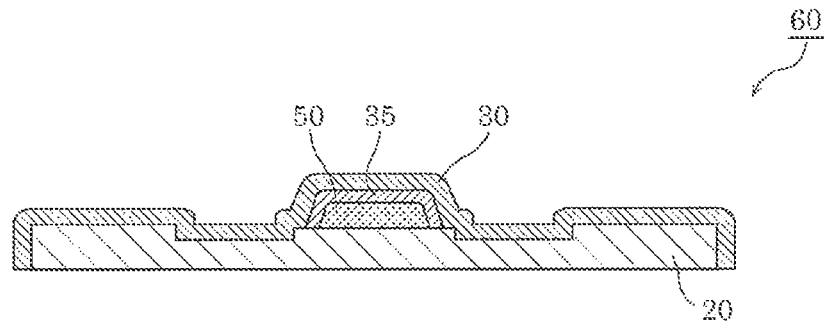
FIG. 3B is a cross-sectional view of the prepared slide according to Embodiment 1.

FIG. 3A is a schematic configuration diagram of a prepared slide according to Embodiment 1, and FIG. 3B is a cross-sectional view of the prepared slide according to Embodiment 1. To be specific, FIG. 3B is a cross-sectional view taken along the line 3B-3B shown in FIG. 3 Prepared slide 60 according to the present embodiment is a slide that has been processed such that specimen 50 to be observed is ready to be observed. The orientation of prepared slide 60 shown in FIGS. 3A and 3B is reversed from the orientation of glass slide 20 shown in FIGS. 1, 2A and 2B, or in other words, the front surface and the back surface are reversed.

Glass slide 20 is a transparent substrate having a first main surface (front surface) and a second main surface (back surface). As shown in FIG. 3A, on the front surface of glass slide 20, two grooves are formed in a lengthwise direction of glass slide 20. The two grooves function as a positioning guide for positioning image sensor 10, which will be described later.

As shown in FIGS. 3A and 3B, specimen 50 is an object to be imaged that is disposed on the front surface of glass slide 20, and is, for example, a pathological section obtained directly from an affected area of a patient, the pathological section having a size of about 5 mm to 20 mm and a thickness of about several micrometers. With this configuration, patient's pathological diagnosis is performed. Also, specimen 50 may be, for example, cell tissue dissected from an animal or a plant in a student experiment or the like.

As shown in FIGS. 3A and 3B, encapsulating member 35 is a volatile encapsulant disposed so as to cover specimen 50 that is disposed on the front surface of glass slide 20. Encapsulating member 35 is made of, for example, a resin, and has a function of transmitting incident light with low loss and preventing specimen 50 from aging due to the ambient environment.

As shown in FIGS. 3A and 3B, transparent film 30 is a nonvolatile transparent member attached to a center region of the front surface of glass slide 20, and specimen 50 and encapsulating member 35 are sandwiched between transparent film 30 and glass slide 20. Transparent film 30 has a function of transmitting incident light with low loss and preventing specimen 50 and encapsulating member 35 from aging due to the ambient environment. The configuration of transparent film 30 will be described in detail in the section "1-5. Configuration of Transparent Film", which will be described later.

[1-2. Configuration of Fixing Member]

Figure 4A:
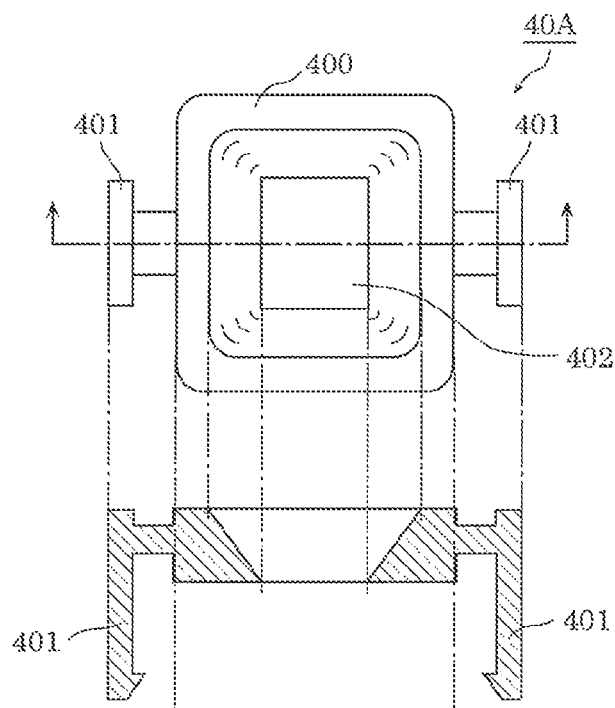
FIG. 4A shows a plan view and a cross-sectional view of a second base member according to Embodiment 1.
Figure 4B:
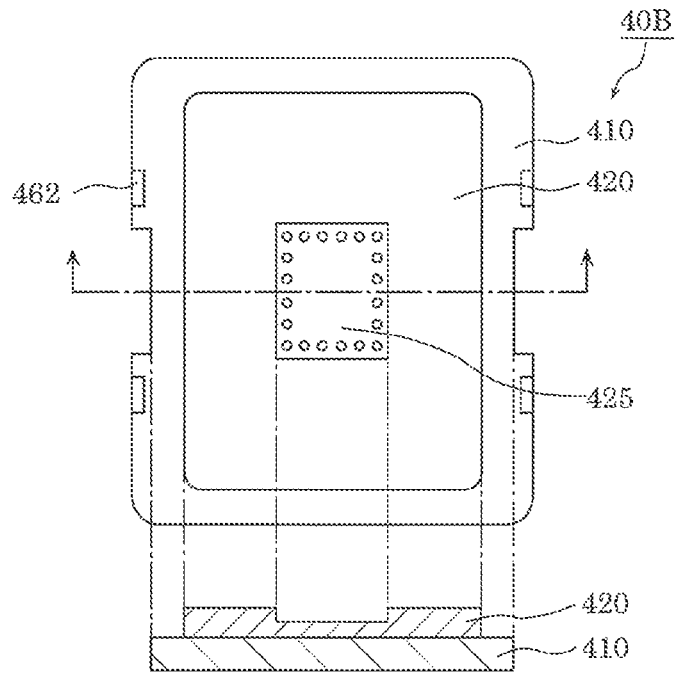
FIG. 4B shows a plan view and a cross-sectional view of a first base member according to Embodiment 1.

FIG. 4A shows a plan view and a cross-sectional view of a second base member according to Embodiment 1, and FIG. 4B shows a plan view and a cross-sectional view of a first base member according to Embodiment 1.

As shown in FIG. 4A, base member 40A is a second base member including a main body 400 having opening 402 formed therein and a latching portion 401. Opening 402 has a function of guiding incident light to specimen 50, and has a trapezoidal shape (tapered shape) whose upper base edge is longer than the lower base edge as viewed in cross section. This shape improves the light collecting efficiency of collecting light that is incident from the upper side to the lower side in the cross-section shown in FIG. 4A.

As shown in FIG. 4B, base member 40B is a first base member including upper plate 420 having recessed portion 425 and lower plate 410. Image sensor 10 is disposed in recessed portion 425, and an image signal of image sensor 10 is output to the outside through an electric interconnect formed so as to extend through lower plate 410 from recessed portion 425. To be specific, for example, in recessed portion 425, a signal input terminal for transmitting the image signal of image sensor 10 to upper plate 420. Also, on the back surface of lower plate 410, an external connection terminal that outputs the image signal to outside electronic prepared slide 1 is disposed. In base member 40B, the electric interconnect that electrically connects the signal input terminal and the external connection terminal is formed. Also, in lower plate 410, guide 462 for fixing the position of glass slide 20 in a lateral direction of glass slide 20 on base member 40B is provided.

[1-3. Positional Relationship Between Constituent Elements]

As shown in FIG. 2A and FIG. 2B, image sensor 10, transparent film 30, encapsulating member 35, specimen 50, and glass slide 20 are disposed in this order between base member 40B and base member 40A, and they are fixed by base member 40A latching onto base member 40B. To be specific, they are fixed as a result of the hook portions of latching portion 401 being fitted into the recessed portions in the middle of each side of lower plate 410. Here, image sensor 10 is not in direct contact with specimen 50 and encapsulating member 35, and only transparent film 30 is interposed therebetween, and is not bonded. To rephrase, the light receiving surface of image sensor 10 is in contact with transparent film 30 at the surface opposite to the surface of transparent film 30 that is in contact with encapsulating member 35. With this configuration, image sensor 10 and prepared slide 60 are detachably fixed by a fixing member composed of base member 40B and base member 40A.

Also, as shown in FIG. 2B, resin protruding portions (resin protruding portions 16 shown in FIG. 5, which will be described later) formed at the end portions of image sensor 10 are fitted into the grooves formed in glass slide 20, and the position between glass slide 20 and the light receiving surface of image sensor 10 is thereby fixed.

[1-4. Configuration of Solid State Imaging Element]

Figure 5:
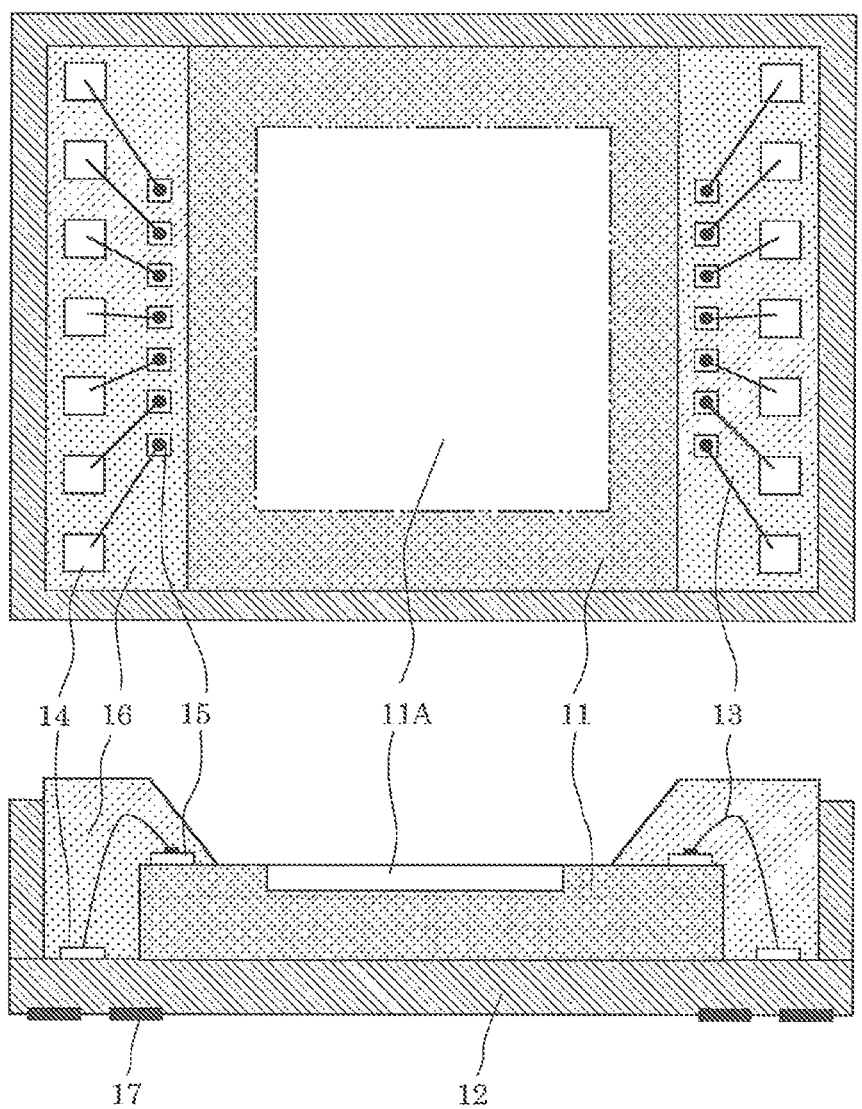
FIG. 5 shows a plan view and a cross-sectional view of a solid state imaging element (image sensor) according to Embodiment 1.

FIG. 5 shows a plan view and a cross-sectional view of a solid state imaging element (image sensor) according to Embodiment 1.

As shown in FIG. 5, image sensor 10 according to the present embodiment includes semiconductor chip 11, package substrate 12 that is disposed on the back surface side of semiconductor chip 11, wires 13 that electrically connect semiconductor chip 11 and package substrate 12, and resin protruding portions 16 formed by filling a wire forming region with resin.

Semiconductor chip 11 includes imaging region 11A in which a plurality of pixels are disposed in a matrix. In electronic prepared slide 1, specimen 50 and encapsulating member 35 are opposed to imaging region 11A via transparent film 30. Also, semiconductor chip 11 includes, in an area around imaging region 11A, a signal output circuit, a denoising circuit, a signal conversion circuit such as an AD converter, a signal amplification circuit, and the like.

Regarding the pixel size of commonly used CCD (Charge Coupled Device) image sensors and CMOS (Complementary Metal-Oxide Semiconductor) image sensors, even with the use of the most recent microfabrication techniques, the space that can be used to receive light is still limited. This is because most of the pixel area is occupied by electronic components (a field effect transistor, and the like) required for a driving circuit. In order to solve this problem and image the microstructure of specimen 50 with high accuracy, image sensor 10 according to the present embodiment is a photoelectric conversion film stacked solid state imaging element including, as a top layer, a photoelectric conversion film that captures light and converts the captured light to an electric signal. However, as will be described later, image sensor 10 according to the present disclosure is not limited to the photoelectric conversion stacked solid state imaging element.

Hereinafter, the configuration of pixels 100 included in image sensor 10 will be described.

Figure 6:
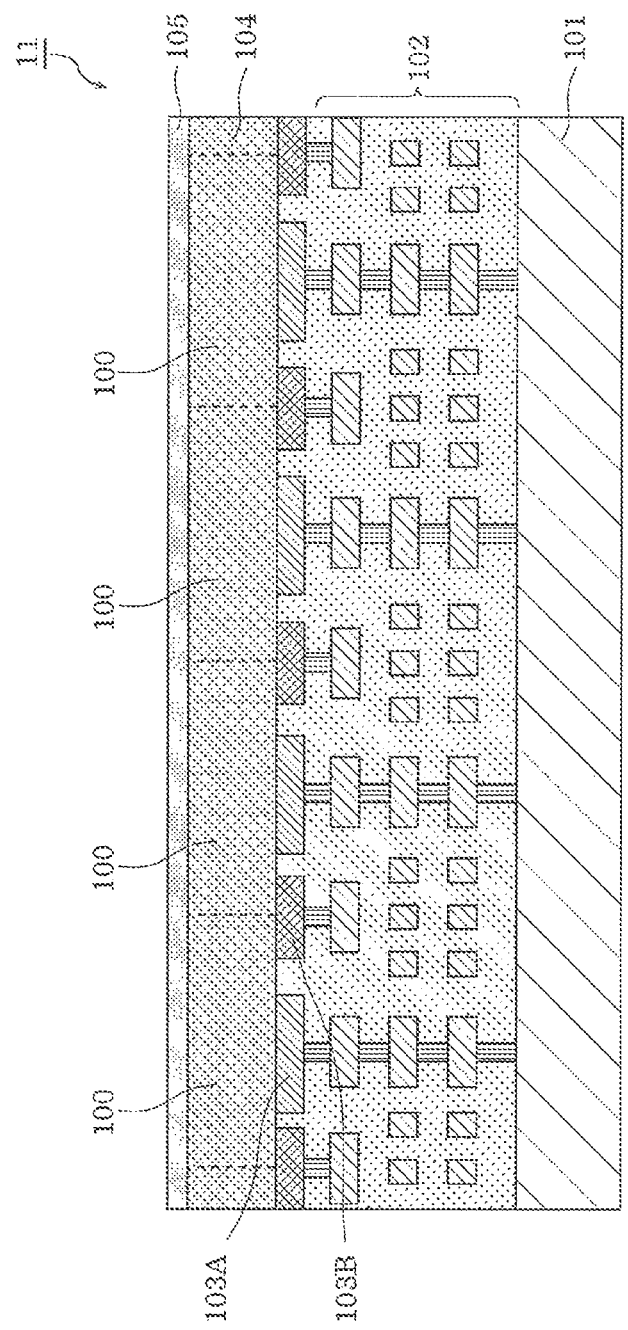
FIG. 6 is a diagram showing a cross-sectional structure of an imaging region in the solid state imaging element (image sensor) according to Embodiment 1.

FIG. 6 is a diagram showing a cross-sectional structure of an imaging region in the solid state imaging element (image sensor) according to Embodiment 1. As shown in the diagram, semiconductor chip 11 of image sensor 10 includes semiconductor substrate 101, interconnect layer 102, pixel electrodes 103A, photoelectric conversion film 104, and transparent electrode 105.

Interconnect layer 102 is formed on semiconductor substrate 101. Pixel electrodes 103A are formed in interconnect layer 102 in a separated manner for each pixel 100. Photoelectric conversion film 104 is formed on pixel electrodes 103A. Transparent electrode 105 is formed on photoelectric conversion film 104.

As the material for photoelectric conversion film 104, any material can be used such as an organic material or an inorganic material having a high efficiency of converting light to electric charges, but photoelectric conversion film 104 is, for example, made of an organic material. In the case where an organic photoelectric conversion film is used as a photoelectric conversion element in a photodiode whose thickness and shape need to be adjusted according to the wavelength band of incident light to be received, due to high light absorption rate, even if the thickness is reduced (typically about 0.5 um), it is possible to implement a sensitivity higher than that of Si photodiodes. Furthermore, as a result of reducing the thickness of the photoelectric conversion film as described above, even when light is obliquely incident on each pixel, because the propagation distance within the photoelectric conversion film is short, namely, is less than or equal to the wavelength, and thus the light does not propagate to adjacent pixels, or in other words, it is possible to receive light with low crosstalk. Accordingly, it is possible to implement an optical system having a wide light reception angle.

Also, in CCD image sensors and front illuminated CMOS image sensors, their front surface may have a height difference. Also, in back illuminated CMOS image sensors, a light shielding layer for acquiring a high-resolution image may be formed on the light receiving surface. That is, the light receiving surface that is opposed to the specimen is not flat.

In contrast, the light receiving surface of photoelectric conversion film stacked image sensor 10 that includes photoelectric conversion film 104 according to the present embodiment is flat as can be seen from FIG. 6. With this configuration, it is possible to make the distance between specimen 50 and the light receiving surface short and uniform between a plurality of pixels.

Furthermore, in the case where photoelectric conversion film stacked image sensor 10 having a high planarity is combined with transparent film 30, it is possible to maintain a short distance between specimen 50 and light receiving surface and maintain the distance uniform between a plurality of pixels.

Accordingly, with the use of photoelectric conversion film stacked image sensor 10 that includes photoelectric conversion film 104 according to the present embodiment, and electronic prepared slide 1 (or electronic prepared slide 2 according to Embodiment 2, which will be described later) that includes photoelectric conversion film stacked image sensor 10 according to the present embodiment, it is possible to observe a more detailed structure of specimen 50.

With the configuration described above, in image sensor 10, photoelectric conversion film 104 is formed on semiconductor substrate 101, instead of a photodiode formed on the semiconductor substrate. Typically, photoelectric conversion film 104 and transparent electrode 105 are formed over entire imaging region 11A.

Incident light is converted to electric charges according to the amount of the incident light by photoelectric conversion film 104, and the electric charges for each pixel 100 are collected by pixel electrode 103A. With the configuration described above, even when incident light is incident obliquely, the incident light is not blocked by the interconnect of interconnect layer 102, and it is therefore possible to achieve a high light collecting efficiency.

In FIG. 6, dummy electrodes 103B are disposed in close proximity to pixel electrodes 103A. As described above, in the image sensor including a photoelectric conversion film (referred to as "photoelectric conversion film stacked image sensor"), a high light collecting efficiency can be attained, but because photoelectric conversion film 104 is formed over imaging region 11A, electric charges are also generated in boundary regions between pixels 100, which reduces the isolation between pixels. To address this, a predetermined potential difference is applied between transparent electrode 105 and dummy electrodes 103B so as to cause the electric charges generated in the boundary regions between pixels to be drawn into dummy electrodes 103B. The isolation between pixels is thereby improved.

The function of dummy electrodes 103B is not limited to improving the isolation between pixels. Focus detection may be performed by using the electric charges drawn into dummy electrodes 103B. Also, dummy electrodes 103B may be omitted.

Also, in image sensor 10 according to the present embodiment, the distance from the light receiving surface to specimen 50 (the distance substantially corresponding to the total thickness of a device surface protection film of the image sensor and transparent film 30) is short, or in other words, the focal distance is short. However, if priority is given to sensitivity characteristics (i.e., image brightness) of image sensor 10, microlenses may be disposed above transparent electrode 105. The microlenses include at least a microlens (top lens) that is disposed above the protection film (uppermost layer film) of image sensor 10 and is made of an inorganic material or the like and a microlens (inner lens) that is disposed within the interlayer insulating film of image sensor 10. To rephrase, in image sensor 10 according to the present embodiment, at least one of a top lens and an inner lens may be disposed.

If, on the other hand, priority is given to improvement of image characteristics such as smear and color mixing by causing incident light to perpendicularly reach imaging region 11A (to rephrase, by reducing oblique light components), it is possible to use, for example, a structure that does not include a microlens.

Also, by not providing a microlens, the distance between the light receiving surface and specimen 50 can be reduced, and it is therefore possible to obtain a video having a higher resolution. Also, because the step of forming microlenses can be omitted, the production cost of semiconductor chip 11 can be reduced.

Furthermore, according to the present disclosure, by not providing a microlens, image sensor 10 itself can have a high planarity, which facilitates the formation of transparent film 30 on image sensor 10. Accordingly, the effect of observing a more detailed structure of specimen 50 can be enhanced.

Furthermore, as will be described later, by not providing a microlens (top lens), it is possible to perform an oxygen-plasma treatment (surface treatment) on the light receiving surface with ease.

Also, in semiconductor chip 11, for each pixel 100, an amplifying transistor, a reset transistor, a select transistor, and an interconnect that connects these transistors are formed within interconnect layer 102 and semiconductor substrate 101. With this configuration, electric charges generated in photoelectric conversion film 104 are output as a pixel signal via an output terminal of image sensor 10.

Referring back to FIG. 5, the configuration of image sensor 10 will be described.

Package substrate 12 accommodates semiconductor chip 11. Semiconductor chip 11 is fixed on package substrate 12 with an adhesive or the like. Electrode pads 14 that are electrically connected to semiconductor chip 11 are provided on the upper surface of package substrate 12. Output terminals 17 are formed on the back surface of package substrate 12, and thus an electrical connection to the outside of image sensor 10 can be established.

The shape of output terminals 17 can be a ball, bump or land shape, but the shape is not limited thereto. By selecting such output terminals 17, connection to the signal input terminal provided in recessed portion 425 of base member 40B is facilitated. Also, output terminals 17 can be arranged in a grid on the back surface, and it is therefore possible to cope with a multi-pin configuration.

As the material for package substrate 12, for example, ceramic or an organic material can be used. With the use of ceramic, a thermal expansion difference with respect to semiconductor chip 11 caused by temperature change can be suppressed, and the reliability can be enhanced. When a substrate made of an organic material is used, production at a low cost can be achieved.

Wires 13 electrically connect electrode pads 15 that are formed on semiconductor chip 11 and electrode pads 14 that are formed on package substrate 12. FIG. 5 shows, as an example, a so-called normal bonding technique in which ball bonding is used for semiconductor chip 11 and stitch bonding is used for package substrate 12.

Also, resin protruding portions 16 are formed to prevent wires 13 and electrode pads 14 and 15 from being exposed to the ambient air. Resin protruding portions 16 are formed by filling a region including wires 13, electrode pads 14 and 15 with resin. With this configuration, it is possible to prevent wires 13, electrode pads 14 and 15 from deteriorating due to moisture and extraneous matter, and improve the reliability. Furthermore, the top portions of resin protruding portions 16 form two ridgeline portions that are opposed across semiconductor chip 11. As shown in FIG. 2B, as a result of the two ridgeline portions being fitted into the grooves formed in glass slide 20, the position between glass slide 20 and the light receiving surface of image sensor 10 is fixed, and the light receiving surface of semiconductor chip 11 and specimen 50 can be brought into close proximity to each other with transparent film 30 interposed therebetween.

Image sensor 10 according to the present embodiment has a structure in which semiconductor chip 11 and package substrate 12 are electrically connected via wires 13, but the structure is not limited thereto. The image sensor according to the present embodiment may have, instead of the wire structure, a so-called TSV (Through Silicon Via) structure in which conductors are embedded in holes passing through semiconductor substrate 101 of semiconductor chip 11 so as to provide terminals on the back surface of semiconductor substrate 101.

[1-5. Configuration of Transparent Film]

A description will now be given of the configuration of transparent film 30 that can detachably fix image sensor 10 and prepared slide 60 and provide a high imaging accuracy in electronic prepared slide 1 according to the present embodiment, with reference to FIGS. 1, 2A and 2B.

Transparent film 30 is a nonvolatile transparent member that is disposed on the light receiving surface of image sensor 10 and seals the light receiving surface. Also, transparent film 30 is disposed so as to be removable from the light receiving surface of image sensor 10.

To rephrase, transparent film 30 is disposed so as to be in close contact with specimen 50 and the light receiving surface of image sensor 10. Furthermore, transparent film 30 has elasticity or wettability so that it can deform at the contact surfaces so as to fit to irregularities on specimen 50 and the light receiving surface of image sensor 10.

Also, transparent film 30 needs to sandwich specimen 50 and encapsulating member 35 together with glass slide 20. With this configuration, specimen 50 can be stored for a long period of time without causing degradation while being held on glass slide 20.

Also, transparent film 30 may have a light transmittance higher than that of glass slide 20 in the range of visible light (wavelength ranging from 300 nm to 800 nm), and a light transmittance of 80%. It is thereby possible to cause the light that has passed through specimen 50 to reach image sensor 10 with low loss.

Also, the difference in refractive index between transparent film 30 and encapsulating member 35 is, for example, 0.2 or less. As the difference in refractive index between transparent film 30 and encapsulating member 35 increases, the linearity of light that has passed through specimen 50 decreases, which reduces the resolution of image. From this viewpoint, by substantially equalizing the difference in refractive index between transparent film 30 and encapsulating member 35, the linearity of light that has passed through specimen 50 is attained, and thus it is possible to image specimen 50 with a high resolution.

Also, in electronic prepared slide 1, from the viewpoint of acquiring a high resolution image, it is possible to use, for example, a configuration in which incident light reaches specimen 50 and the light receiving surface of image sensor 10 in the form of collimated light without being diffused. From this viewpoint, the distance between specimen 50 and the light receiving surface of image sensor 10 may be short. To be more specific, the thickness of transparent film 30 is, for example, less than or equal to the array pitch of a plurality of pixels 100 arranged in a matrix. With this configuration, it is possible to acquire an image in which the image resolution of image sensor 10 is reflected, without reducing the image resolution of image sensor 10.

Also, the thickness of transparent film 30 may be, for example, 1 μm or less. With this configuration, it is possible to acquire a highly accurate image in which the high image resolution of image sensor 10 is reflected, without reducing the high image resolution of image sensor 10 in the visible light region where the wavelength band ranges from 300 nm to 800 nm.

Also, transparent film 30 may be in contact with encapsulating member 35 without chemically reacting with encapsulating member 35. With this configuration, the discoloration and the degradation of transparent film 30 are suppressed, and it is possible to achieve low loss of light that has passed through specimen 50 and the long-term storage of specimen 50.

Also, transparent film 30 is made of, for example, a material that is insoluble in a dilution/dissolution agent for encapsulating member 35. The dilution/dissolution agent for encapsulating member 35 is, for example, a xylene solvent. This suppresses the degradation of transparent film 30 due to the dilution/dissolution agent for encapsulating member 35 in the process of forming prepared slide 60. Accordingly, it is possible to achieve low loss of light that has passed through specimen 50 and the long-term storage of specimen 50.

Examples of the material for transparent film 30 include a plastic resin film, an inorganic glass film, and a composite material glass film.

As described above, according to electronic prepared slide 1 of the present embodiment, image sensor 10 itself can output an image signal (electronic signal) without the use of an expensive microscopic imaging apparatus, and the cost required for observation (examination cost) can be reduced significantly. That is, electronic prepared slide 1 according to the present embodiment can widely expand the use of high level pathological diagnosis.

Also, because transparent film 30 having the features described above is interposed between the light receiving surface of image sensor 10 and specimen 50, it is possible to prevent image sensor 10 from being damaged while maintaining the high imaging accuracy of image sensor 10. Accordingly, it is possible to acquire data of observed specimen having a high level of image accuracy at a low cost. In the case of a configuration in which the light receiving surface of image sensor 10 and encapsulating member 35 are in contact without transparent film 30 interposed therebetween, the light receiving surface and encapsulating member 35 come in close contact. As a result, a stress is applied to the light receiving surface by encapsulating member 35, and thus there is a possibility that the light receiving surface may deform or degrade. Also, when the light receiving surface and encapsulating member 35 are separated, there is also a possibility that the light receiving surface may deform or degrade. In contrast, with the configuration in which transparent film 30 is interposed between the light receiving surface of image sensor 10 and encapsulating member 35, it is possible to prevent the deformation or degradation of the light receiving surface as described above.

Also, because specimen 50 is protected by transparent film 30, glass slide 20 and encapsulating member 35, the deterioration of specimen 50 can be prevented. That is, specimen 50 is stored in the form of prepared slide 60, and thus highly accurate re-examination is possible even after long-term storage.

[2. Electronic Prepared Slide Assembly Method]

Next, an electronic prepared slide assembly method for assembling electronic prepared slide 1 according to the present embodiment will be described with reference to FIGS. 7 and 8.

Figure 7:
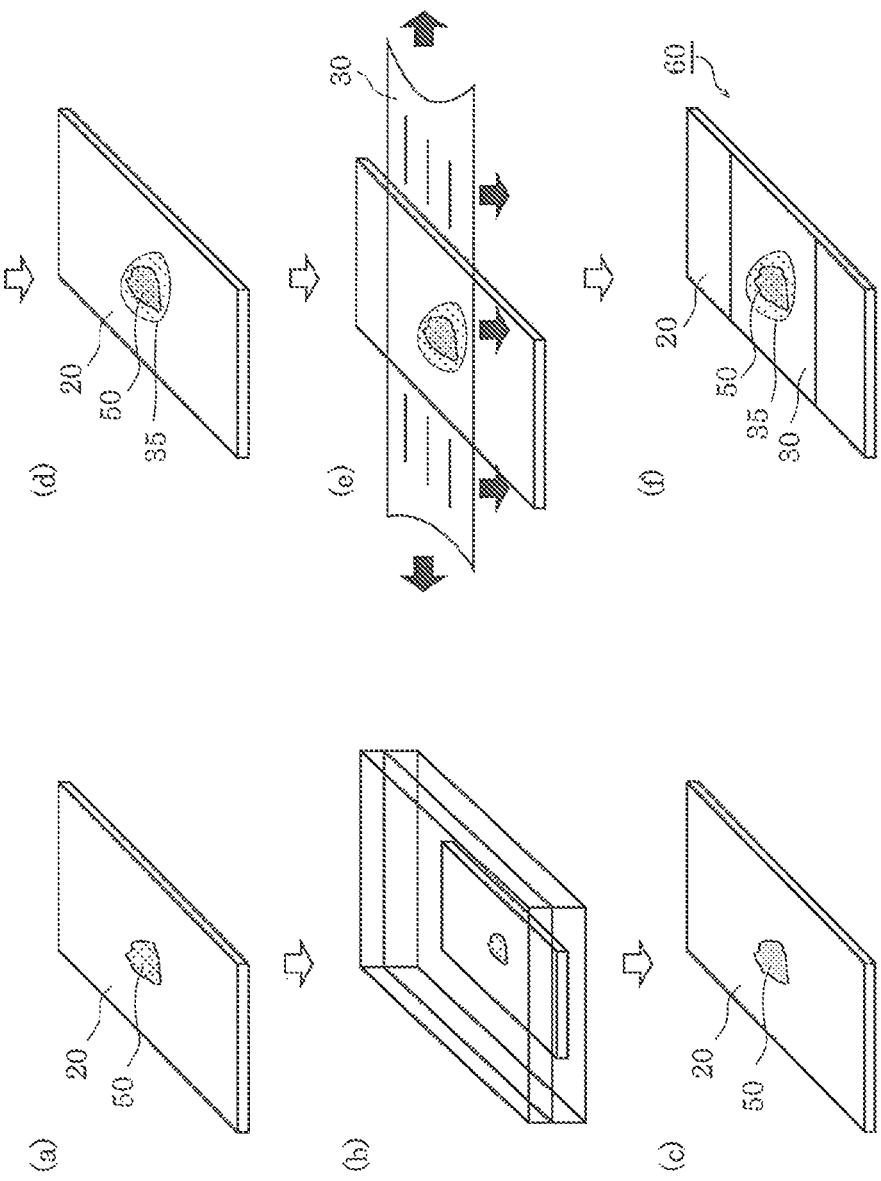
FIG. 7 is a process chart illustrating a method for forming a prepared slide according to Embodiment 1.
Figure 8:
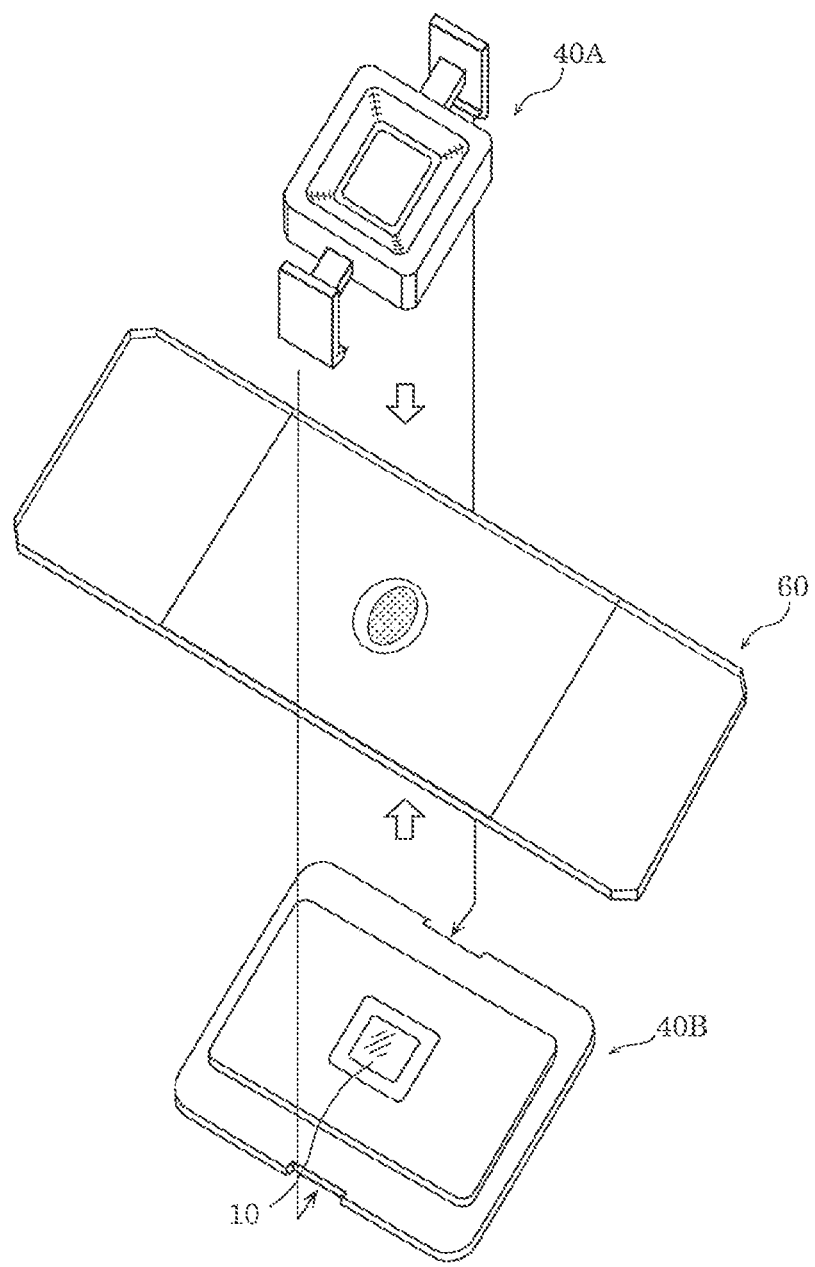
FIG. 8 is a process chart illustrating a method for assembling an electronic prepared slide according to Embodiment 1.

FIG. 7 is a process chart illustrating a method for forming a prepared slide according to Embodiment 1. FIG. 8 is a process chart illustrating a method for assembling an electronic prepared slide according to Embodiment 1.

First, as shown in (a) in FIG. 7, a pretreatment of specimen 50 is performed (specimen preparation step). For instance, an obtained specimen is dehydrated and embedded in paraffin. After that, the paraffin-embedded specimen is cut into a slice having a desired thickness of about several to several tens μm, and deparaffinized specimen 50 is disposed on the front surface of glass slide 20.

Next, as shown in (b) in FIG. 7, specimen 50, together with glass slide 20, is immersed in a staining solution. As shown in (c) in FIG. 7, specimen 50 is thereby stained.

Next, as shown in (d) in FIG. 7, encapsulating member 35 is disposed so as to cover specimen 50 by applying an encapsulant to specimen 50 (encapsulating member disposing step).

Next, as shown in (e) in FIG. 7, a transparent sheet that is a preform for transparent film 30 is brought into close contact with a center region in the front surface of glass slide 20 and encapsulating member 35 while the transparent sheet is stretched in a plane direction of glass slide 20, and transparent film 30 having a thickness smaller than the transparent sheet is thereby disposed on the front surface of glass slide 20 (transparent film disposing step). That is, transparent film 30 is disposed on the front surface of glass slide 20 such that specimen 50 and encapsulating member 35 are sandwiched between transparent film 30 and glass slide 20. As a result, as shown in (0 in FIG. 7, prepared slide 60 that is integrated with glass slide 20 and that is sealed and insulated from the ambient air is formed. As a specific method for stretching the transparent sheet, a rolling method may be used.

Next, prepared slide 60 and image sensor 10 are brought into close contact to each other and fixed. As shown in FIG. 8, glass slide 20 and image sensor 10 are detachably fixed such that transparent film 30 is sandwiched between the light receiving surface of image sensor 10 and specimen 50 (fixing step). To be specific, prepared slide 60 is sandwiched between and fixed by base member 40A and base member 40B in which image sensor 10 is fitted into recessed portion 425, with the front surface side of prepared slide 60, on which specimen 50, encapsulating member 35 and transparent film 30 are disposed, facing toward base member 40B and the back surface side of prepared slide 60 facing toward base member 40A. At this time, the positional relationship between prepared slide 60, base member 40A and base member 40B is adjusted such that opening 402 of base member 40A and specimen 50 are aligned in a state in which prepared slide 60 is viewed in plan view. In this state, the hook portions of latching portion 401 are fitted into the recessed portions in the middle of each side of lower plate 410. Image sensor 10 is thereby brought into close proximity to specimen 50 and encapsulating member 35 with only transparent film 30 interposed therebetween, without being in direct contact with each other, and is not bonded thereto. Accordingly, image sensor 10 and prepared slide 60 are detachably fixed.

As described above, according to the electronic prepared slide assembly method of the present embodiment, because transparent film 30 having the features described above is interposed between the light receiving surface of image sensor 10 and specimen 50, it is possible to prevent image sensor 10 from being damaged while maintaining the high imaging accuracy of image sensor 10.

Also, image sensor 10 and prepared slide 60 that have been once fixed can be separated from each other without causing damage to the light receiving surface of image sensor 10 by separating base member 40A and base member 40B from each other, and thus one image sensor 10 can be applied to multiple prepared slides 60. Accordingly, it is possible to acquire data of observed specimens having a high level of imaging accuracy at a low cost.

[3. Electronic Prepared Slide Assembly Set]

Electronic prepared slide 1 according to Embodiment 1 is an embodiment of a finished product in which prepared slide 60, image sensor 10, and base members 40A and 40B are assembled, but the present disclosure is not limited to the above embodiment, and also encompasses an electronic prepared slide assembly set that is an embodiment before prepared slide 60, image sensor 10 and the fixing member are assembled.

That is, an electronic prepared slide assembly set according to a variation of the present embodiment includes glass slide 20 for supporting specimen 50, encapsulating member 35 for encapsulating specimen 50, transparent film 30 for, together with glass slide 20, sandwiching specimen 50 and encapsulating member 35, image sensor 10 for receiving light that has passed through specimen 50 via transparent film 30, and base members 40A and 40B for detachably fixing glass slide 20 and image sensor 10.

By assembling the components of the electronic prepared slide assembly set described above, electronic prepared slide 1 according to Embodiment 1 is produced, and the same effects as those of electronic prepared slide 1 can be obtained.

[4. Imaging System for Electronic Prepared Slide]

Next, an imaging system for electronic prepared slide 1 will be described.

[4-1. Socket]

Figure 9:
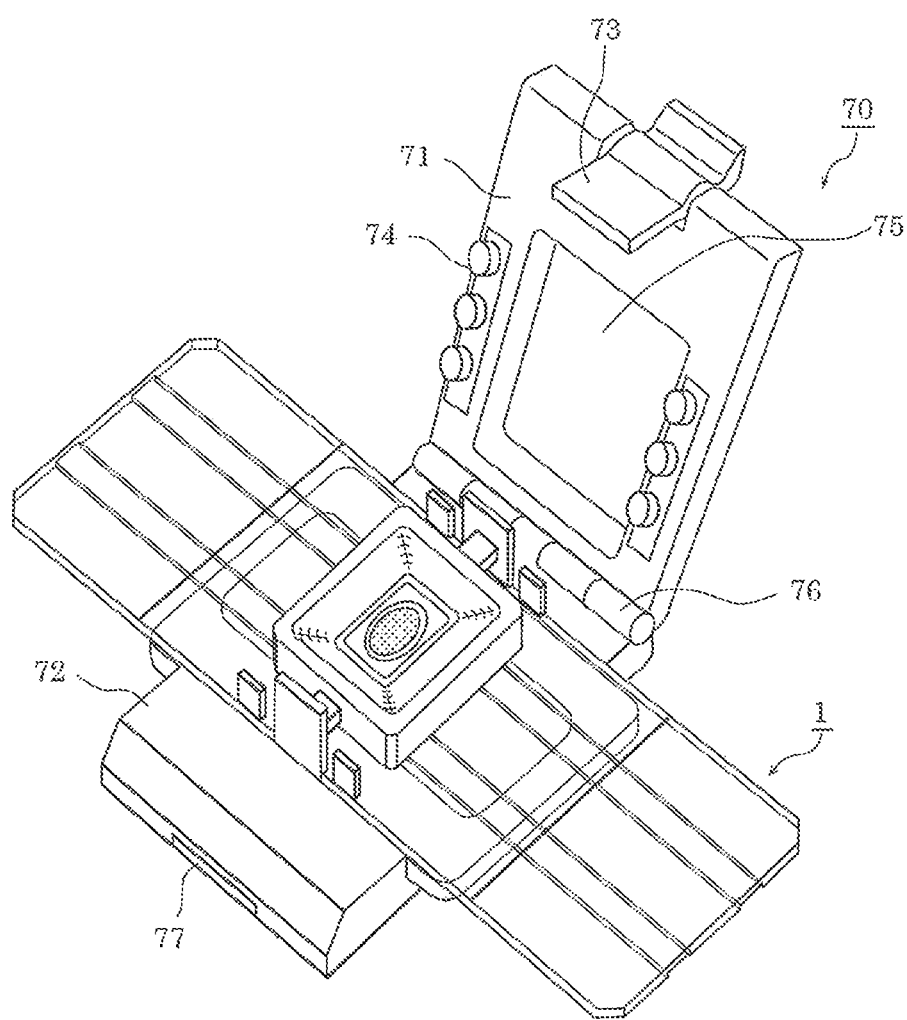
FIG. 9 is an external perspective view of a socket in which the electronic prepared slide according to Embodiment 1 is incorporated.

FIG. 9 is an external perspective view of a socket into which the electronic prepared slide according to Embodiment 1 is incorporated. The diagram shows a state in which electronic prepared slide 1 is placed in a socket 70. Socket 70 includes socket base members 71 and 72, engaging portion 73, and hinge 76.

Socket base member 71 includes an opening 75 into which base member 40A of electronic prepared slide 1 can be inserted and a pressing portion 74 that, together with socket base member 72, presses glass slide 20.

Socket base member 72 includes recessed portion 77 into which the hook of engaging portion 73 can be fitted. Although not shown in the diagram, in socket base member 72, an electric interconnect that is electrically connected to an external connection terminal provided on base member 40B of electronic prepared slide 1 is provided so as to extend from the front surface (upper surface) on which electronic prepared slide 1 is placed to the back surface (lower surface). On the lower surface of socket base member 72, an external connection terminal for transmitting an image signal of image sensor 10 to an external measurement device via the electric interconnect is provided.

With the configuration described above, from the state shown in FIG. 9, socket base member 71 is rotated about hinge 76 so as to cause the hook of engaging portion 73 to be fitted into recessed portion 77, and socket base member 71 is thereby fixed to socket base member 72. As a result, electronic prepared slide 1 is fixed between socket base members 71 and 72. In this state, it is possible to cause incident light to reach the light receiving surface of image sensor 10 via opening 75 and opening 402.

[4-2. Image Acquisition Apparatus]

Figure 10A:
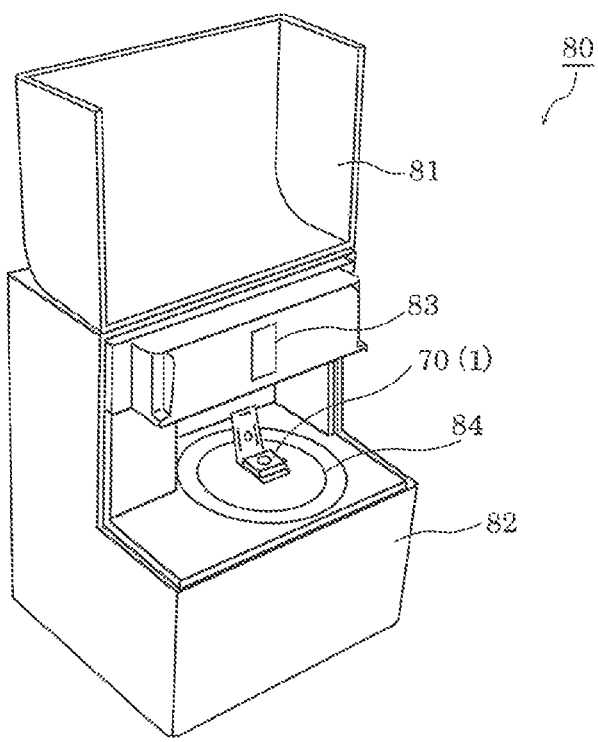
FIG. 10A is an external perspective view of an image acquisition apparatus according to Embodiment 1 when it is opened.
Figure 10B:
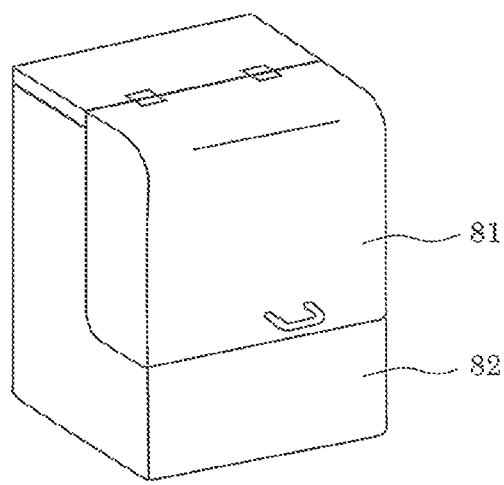
FIG. 10B is an external perspective view of the image acquisition apparatus according to Embodiment 1 when it is closed.

FIG. 10A is an external perspective view of an image acquisition apparatus according to Embodiment 1 when it is opened, and FIG. 10B is an external perspective view of the image acquisition apparatus according to Embodiment 1 when it is closed. FIG. 10A shows a state in which socket 70 (including electronic prepared slide 1) is loaded onto stage 84 provided on main body 82. Stage 84 is configured such that socket 70 is detachably connected thereto. Image acquisition apparatus 80 includes light source 83, and can apply light to electronic prepared slide 1 from a plurality of different light-application directions by changing the orientation of stage 84. Also, image acquisition apparatus 80 includes cover 81 that can be opened and closed. By closing cover 81, as shown in FIG. 10B, a darkroom can be formed within image acquisition apparatus 80.

Figure 11:
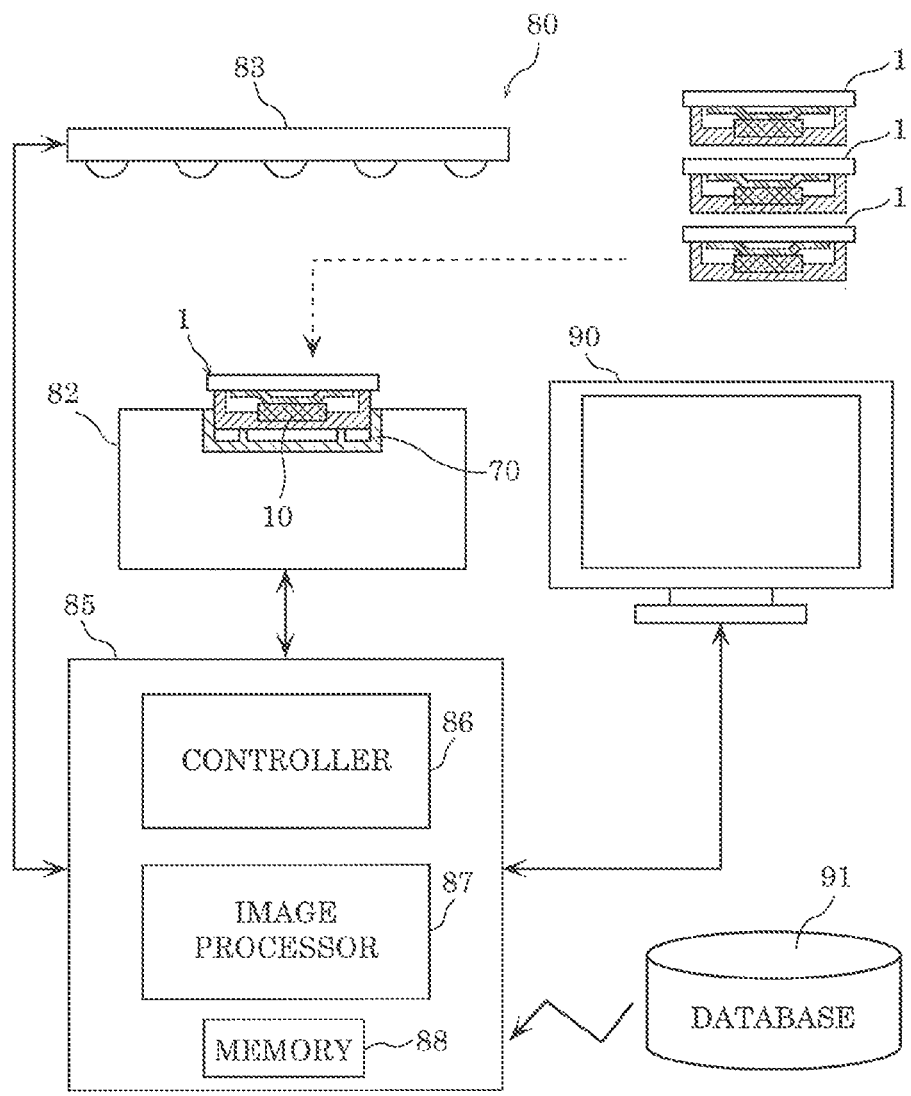
FIG. 11 is a functional block diagram of the image acquisition apparatus according to Embodiment 1.

FIG. 11 is a functional block diagram of the image acquisition apparatus according to Embodiment 1. Image acquisition apparatus 80 includes light source 83 for causing the light that has passed through specimen 50 to be incident on image sensor 10 of electronic prepared slide 1 loaded onto socket 70.

Also, image acquisition apparatus 80 includes control device 85 (computer), and control device 85 includes controller 86, image processor 87, and memory 88.

Controller 86 controls image sensor 10 and light source 83 so as to cause image sensor 10 to image specimen 50.

When image sensor 10 is loaded onto socket 70, image sensor 10 is connected to control device 85 via base member 40B, each terminal of socket base member 72, and the electric interconnect.

Image data acquired by imaging is subjected to synthesis and pixel interpolation processes performed by image processor 87. Through these processes, a high resolution image of specimen 50 is generated. The generated image is displayed on, for example, display 90 and stored in memory 88 or database 91.

Embodiment 2

An electronic prepared slide, a solid state imaging element, and a method for assembling an electronic prepared slide according to the present embodiment are different from the electronic prepared slide, the solid state imaging element, and the method for assembling an electronic prepared slide according to Embodiment 1 in terms of the arrangement of transparent film 30 and the step of forming transparent film 30. Hereinafter, an electronic prepared slide, a solid state imaging element, and a method for assembling an electronic prepared slide according to the present embodiment will be described focusing on differences from electronic prepared slide 1 according to Embodiment 1, image sensor 10 and the method for assembling electronic prepared slide 1.

[5. Configuration of Electronic Prepared Slide]

Figure 12:
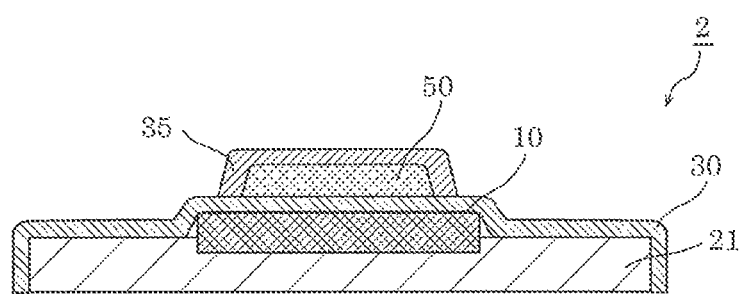
FIG. 12 is a cross-sectional view of an electronic prepared slide according to Embodiment 2.

FIG. 12 is a cross-sectional view of an electronic prepared slide according to Embodiment 2. As shown in FIG. 12, electronic prepared slide 2 according to the present embodiment includes image sensor 10, support substrate 21, transparent film 30, and encapsulating member 35. Hereinafter, the constituent elements of electronic prepared slide 2 will be described.

Support substrate 21 is a substrate having a front surface and a back surface. Support substrate 21 does not need to be transparent, and may be omitted.

Specimen 50 is disposed above the light receiving surface of image sensor 10, which is the surface opposite to the surface of transparent film 30 that is in contact with image sensor 10.

Encapsulating member 35 is disposed so as to cover specimen 50 that is disposed on the surface opposite to the surface of transparent film 30 that is in contact with image sensor 10.

Transparent film 30 is attached to image sensor 10 so as to seal the light receiving surface of image sensor 10.

The materials, physical properties and structures of encapsulating member 35 and transparent film 30 are the same as those of encapsulating member 35 and transparent film 30 according to Embodiment 1.

As shown in FIG. 12, support substrate 21, image sensor 10, transparent film 30, specimen 50, and encapsulating member 35 are disposed in this order, and they are fixed. Electronic prepared slide 2 according to the present embodiment does not require the fixing member of electronic prepared slide 1.

As described above, according to electronic prepared slide 2 of the present embodiment, image sensor 10 itself can output an image signal (electronic signal) without the use of an expensive microscopic imaging apparatus, and the cost required for observation (examination cost) can be reduced significantly. That is, electronic prepared slide 2 according to the present embodiment can widely expand the use of high level pathological diagnosis.

Also, because transparent film 30 is interposed between the light receiving surface of image sensor 10 and specimen 50, it is possible to prevent image sensor 10 from being damaged while maintaining the high imaging accuracy of image sensor 10. Accordingly, it is possible to acquire data of observed specimen having a high level of image accuracy at a low cost. Furthermore, in order to protect the specimen, it is possible to use a configuration in which the top surface is covered with a cover slip.

[6. Electronic Prepared Slide Assembly Method]

Next, an electronic prepared slide assembly method for assembling electronic prepared slide 2 according to Embodiment 2 will be described.

First, a transparent sheet that is a preform for transparent film 30 is brought into close contact with the light receiving surface of image sensor 10 while the transparent sheet is stretched in a plane direction of the light receiving surface of image sensor 10, and transparent film 30 having a thickness smaller than the transparent sheet is thereby disposed on the light receiving surface (transparent film disposing step). That is, transparent film 30 is disposed on the light receiving surface such that the light receiving surface is sealed by the back surface of transparent film 30.

Next, a pretreatment of specimen 50 is performed (specimen preparation step). For instance, an obtained specimen is dehydrated and embedded in paraffin. After that, the paraffin-embedded specimen is cut into a slice having a desired thickness of about several to several tens μm, and deparaffinized specimen 50 is disposed on the front surface of transparent film 30.

Next, specimen 50, together with image sensor 10 and transparent film 30, is immersed in a staining solution. Specimen 50 is thereby stained.

Finally, encapsulating member 35 is disposed so as to cover specimen 50 by applying an encapsulant to specimen 50 (encapsulating member disposing step).

As described above, according to the electronic prepared slide assembly method of the present embodiment, because transparent film 30 is interposed between the light receiving surface of image sensor 10 and specimen 50, it is possible to prevent image sensor 10 from being damaged while maintaining the high imaging accuracy of image sensor 10.

Also, image sensor 10 and specimen 50 that have been once fixed can be separated from each other without causing damage to the light receiving surface of image sensor 10, and thus one image sensor 10 can be applied to multiple specimens 50. Accordingly, it is possible to acquire data of observed specimens having a high level of image accuracy at a low cost.

Embodiment 3

An electronic prepared slide, a solid state imaging element, and a method for assembling an electronic prepared slide according to the present embodiment are different from the electronic prepared slide, the solid state imaging element, and the method for assembling an electronic prepared slide according to Embodiment 1 in terms of the arrangement of a member disposed between specimen 50 and image sensor 10 and the step of forming the member. Hereinafter, an electronic prepared slide, a solid state imaging element, and a method for assembling an electronic prepared slide according to the present embodiment will be described focusing on differences from electronic prepared slide 1, image sensor 10, and the method for assembling electronic prepared slide 1 according to Embodiment 1.

[7. Configuration of Electronic Prepared Slide]

Figure 13:
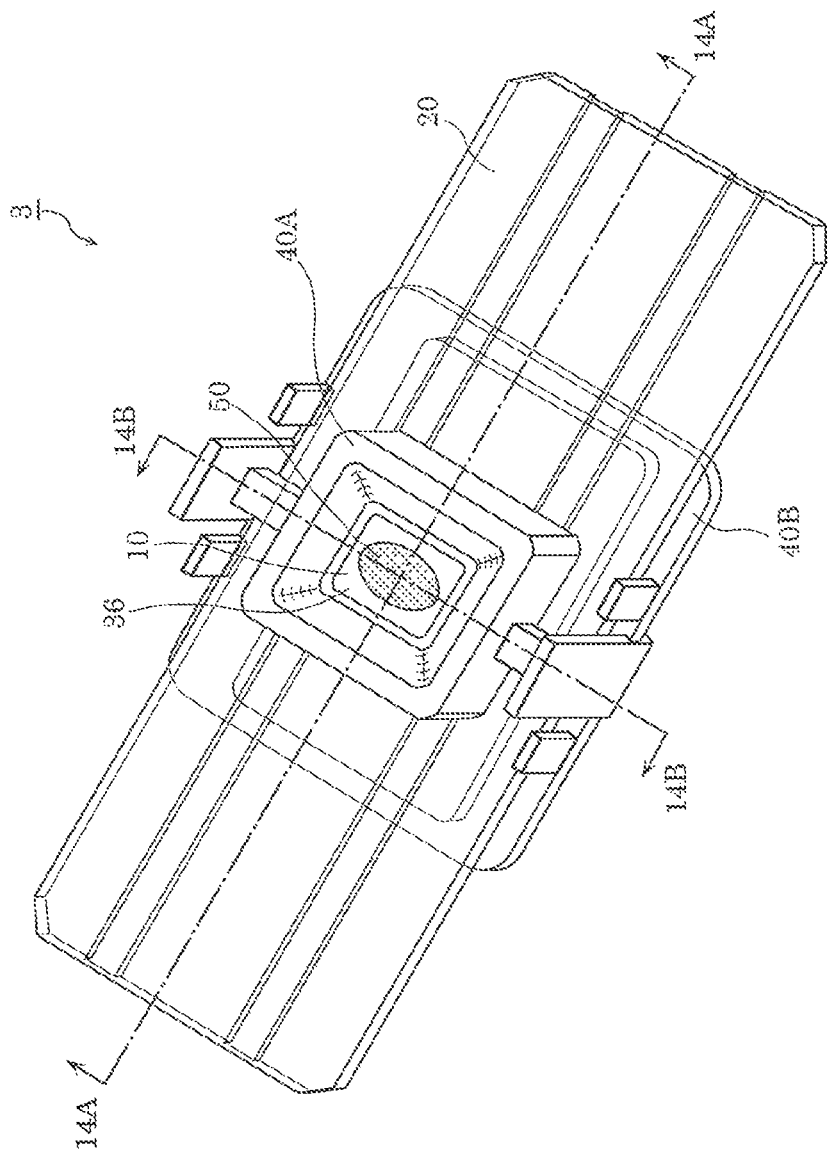
FIG. 13 is an external perspective view of an electronic prepared slide according to Embodiment 3.
Figure 14A:
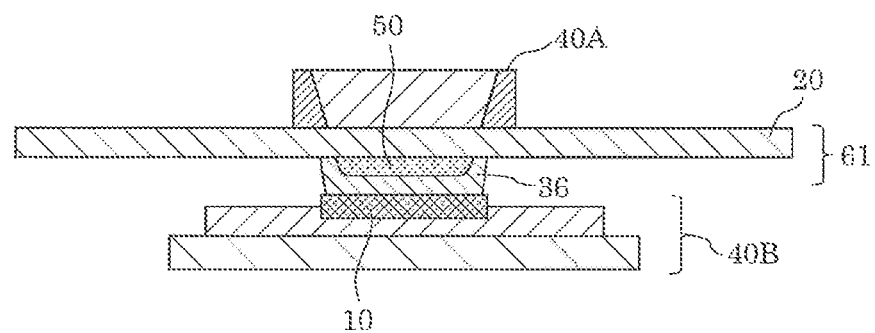
FIG. 14A is a first cross-sectional view of an electronic prepared slide according to Embodiment 3.
Figure 14B:
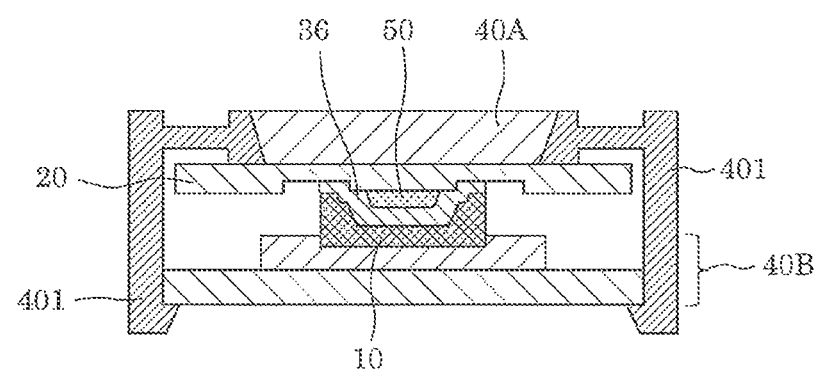
FIG. 14B is a second cross-sectional view of the electronic prepared slide according to Embodiment 3.

FIG. 13 is an external perspective view of an electronic prepared slide according to Embodiment 3. FIG. 14A is a first cross-sectional view of the electronic prepared slide according to Embodiment 3, and FIG. 14B is a second cross-sectional view of the electronic prepared slide according to Embodiment 3. To be specific, FIG. 14A is a cross-sectional view taken along the line 14A-14A shown in FIG. 13, and FIG. 14B is a cross-sectional view taken along the line 14B-14B shown in FIG. 13.

As shown in FIGS. 13, 14A and 14B, electronic prepared slide 3 according to the present embodiment includes image sensor (solid state imaging element) 10, glass slide 20, transparent oil layer 36, and base members 40A and 40B. Glass slide 20, transparent oil layer 36 and specimen 50 constitute a prepared slide. Also, base members 40A and 40B constitute a fixing member.

Electronic prepared slide 3 according to the present embodiment is different from electronic prepared slide 1 according to Embodiment 1 in that encapsulating member 35 is not disposed and transparent oil layer 36 is disposed instead of transparent film 30.

As shown in FIGS. 14A and 14B, transparent oil layer 36 is a nonvolatile transparent member applied to the light receiving surface of image sensor 10. Also, transparent oil layer 36, together with glass slide 20, sandwiches specimen 50. Transparent oil layer 36 has a function of transmitting incident light with low loss and preventing specimen 50 from aging due to the ambient environment. The configuration of transparent oil layer 36 will be described in detail in the section "7-2. Configuration of Transparent Oil Layer", which will be described later.

Also, the configurations of the fixing member and image sensor 10 are the same as those of Embodiment 1, and thus a description thereof is omitted here.

[7-1. Positional Relationship Between Constituent Elements]

As shown in FIGS. 14A and 14B, image sensor 10, transparent oil layer 36, specimen 50, and glass slide 20 are disposed in this order between base member 40B and base member 40A, and they are fixed by base member 40A latching onto base member 40B. To be specific, they are fixed as a result of the hook portions of latching portion 401 being fitted into the recessed portions in the middle of each side of lower plate 410. Here, image sensor 10 is not in direct contact with specimen 50, and the space between the light receiving surface of image sensor 10 and specimen 50 is filled only with transparent oil layer 36. To rephrase, the light receiving surface of image sensor 10 is in contact with transparent oil layer 36 at the surface opposite to the surface of transparent oil layer 36 that is in contact with specimen 50. With this configuration, image sensor 10 is detachably fixed to glass slide 20 on which specimen 50 is disposed by the fixing member composed of base member 40B and base member 40A.

Also, as shown in FIG. 14B, the position between glass slide 20 and the light receiving surface of image sensor 10 is fixed as a result of resin protruding portions (resin protruding portions 16 shown in FIG. 5) formed at end portions of image sensor 10 being fitted into the grooves formed in glass slide 20.

Image sensor 10 according to the present embodiment has the same configuration as that of image sensor 10 according to Embodiment 1, but the light receiving surface that is brought into contact with transparent oil layer 36 may be subjected to a lipophilic treatment (water-repellent treatment) as a surface treatment. There is no particular limitation on the lipophilic treatment performed on the light receiving surface, but for example, an oxygen-plasma treatment (plasma treatment) or the like may be performed on the light receiving surface. Through this, the oil component of transparent oil layer 36 having water repellency uniformly wets the light receiving surface of image sensor 10. Accordingly, no air is present at the contact interface between the light receiving surface and transparent oil layer 36. Because incident light that has passed through specimen 50 does not pass through air at the contact interface, linearity and low loss of incident light are attained.

Furthermore, in the case where the surface treatment is performed, that image sensor 10 may include no microlenses (top lenses) provided thereon. It is thereby possible to prevent plasma damage (surface deterioration, shape deterioration, and the like) on microlenses made of an organic material or the like, as well as preventing poor image quality and the like of image sensor 10 caused by the plasma damage.

In the present disclosure, the surface treatment that is performed on the light receiving surface to be brought into contact with transparent oil layer 36 (or transparent film 30) is not limited to the lipophilic treatment (water-repellent treatment), and it is also possible to perform a surface treatment (for example, hydrophilic treatment) according to the physical properties (material) or the like of transparent oil layer 36 (or transparent film 30).

In the present disclosure, the surface treatment that is performed on the light receiving surface is not limited to the oxygen-plasma treatment (plasma treatment), and it is also possible to use other surface treatments (for example, application, spraying or injection of a chemical solution, or the like).

The surface treatment described above can also be performed on the light receiving surface that is brought into contact with transparent film 30 described in Embodiments 1 and 2.

In addition to transparent oil layer 36, encapsulating member 35 according to Embodiment 1 may be interposed between specimen 50 and the light receiving surface of image sensor 10.

[7-2. Configuration of Transparent Oil Layer]

A description will now be given of the configuration of transparent oil layer 36 in electronic prepared slide 3 according to the present embodiment, transparent oil layer 36 being capable of detachably fixing image sensor 10 and glass slide 20 on which specimen 50 is disposed and providing a high imaging accuracy, with reference to FIGS. 13, 14A and 14B.

Transparent oil layer 36 is a nonvolatile transparent member that is disposed on the light receiving surface of image sensor 10 and seals the light receiving surface. Transparent oil layer 36 is made of a water-repellent oil material. Also, transparent oil layer 36 is disposed so as to be removable from the light receiving surface of image sensor 10.

To rephrase, transparent oil layer 36 is disposed so as to be in close contact with specimen 50 and the light receiving surface of image sensor 10. Furthermore, transparent oil layer 36 has elasticity or wettability so that it can deform at the contact surfaces so as to fit to irregularities on specimen 50 and the light receiving surface of image sensor 10.

Also, transparent oil layer 36 needs to cover specimen 50 together with glass slide 20. With this configuration, specimen 50 can be stored for a long period of time without causing degradation while being held on glass slide 20.

Also, transparent oil layer 36 may have a light transmittance higher than that of glass slide 20 in the range of visible light (wavelength ranging from 300 nm to 800 nm), and a light transmittance of 80%. It is thereby possible to cause the light that has passed through specimen 50 to reach image sensor 10 with low loss.

Also, in electronic prepared slide 3, from the viewpoint of acquiring a high resolution image, it is possible to use a configuration in which incident light reaches specimen 50 and the light receiving surface of image sensor 10 in the form of collimated light without being diffused. From this viewpoint, the distance between specimen 50 and the light receiving surface of image sensor 10 may be short. To be more specific, the thickness of transparent oil layer 36 is, for example, less than or equal to the array pitch of a plurality of pixels 100 arranged in a matrix. With this configuration, it is possible to acquire an image in which the image resolution of image sensor 10 is reflected, without reducing the image resolution of image sensor 10.

Also, the thickness of transparent oil layer 36 may be, for example, 1 μm or less. With this configuration, it is possible to acquire a highly accurate image in which the high image resolution of image sensor 10 is reflected, without reducing the high image resolution of image sensor 10 in the visible light region where the wavelength band ranges from 300 nm to 800 nm.

Transparent oil layer 36 is made of a nonvolatile oil, for example, an oil such as a Class III petroleum.

In the present embodiment, only transparent oil layer 36 is interposed between specimen 50 and the light receiving surface of image sensor 10, and encapsulating member 35 is not interposed therebetween. With this configuration, because transparent oil layer 36 is the only layer made of a different medium disposed between specimen 50 and the light receiving surface of image sensor 10, the number of layers made of different media is reduced as compared to Embodiments 1 and 2. Accordingly, linearity and low loss of incident light are attained.

Also, in the configuration that uses transparent film 30 according to Embodiment 1, if specimen 50 is covered only with transparent film 30 without disposing encapsulating member 35, due to surface irregularities on specimen 50, air may be trapped at the contact interface between transparent film 30 and specimen 50. Here, the refractive index of glass slide 20 is, for example, 1.45, the refractive index of specimen 50 is, for example, 1.3 or more, and the refractive index of transparent film 30 is, for example, 1.45 or more. In this case, there is a possibility that the incident light that has passed through specimen 50 may be refracted by the air (refractive index=1) trapped at the contact interface.

In contrast, transparent oil layer 36 according to the present embodiment is in a liquid phase at room temperature. Accordingly, even if there are surface irregularities on specimen 50, air is not trapped at the contact interface between transparent oil layer 36 and specimen 50, and the contact interface is filled with transparent oil layer 36. With this configuration, the incident light that has passed through specimen 50 does not pass through air at the contact interface, and thus linearity and low loss of incident light are attained.

As described above, according to electronic prepared slide 3 of the present embodiment, image sensor 10 itself can output an image signal (electronic signal) without the use of an expensive microscopic imaging apparatus, and the cost required for observation (examination cost) can be reduced significantly. That is, electronic prepared slide 3 according to the present embodiment can widely expand the use of high level pathological diagnosis.

Also, because transparent oil layer 36 having the features described above is interposed between the light receiving surface of image sensor 10 and specimen 50, it is possible to prevent image sensor 10 from being damaged while maintaining the high imaging accuracy of image sensor 10. Accordingly, it is possible to acquire data of observed specimen having a high level of image accuracy at a low cost. In the case of a configuration in which the light receiving surface of image sensor 10 is in contact with specimen 50 or its encapsulating member without transparent oil layer 36 interposed therebetween, a stress is applied to the light receiving surface by specimen 50 or its encapsulating member, and thus there is a possibility that the light receiving surface may deform or degrade. Also, when the light receiving surface is separated from specimen 50 or its encapsulating member, there is also a possibility that the light receiving surface may deform or degrade. In contrast, with the configuration in which transparent oil layer 36 is interposed between the light receiving surface of image sensor 10 and specimen 50, it is possible to prevent the deformation or degradation of the light receiving surface as described above.

Also, specimen 50 is protected by transparent oil layer 36 and glass slide 20, the deterioration of specimen 50 can be prevented.

[8. Electronic Prepared Slide Assembly Method]

Next, an electronic prepared slide assembly method for assembling electronic prepared slide 3 according to Embodiment 3 will be described with reference to FIG. 15.

FIG. 15 is a process chart illustrating a method for forming a prepared slide according to Embodiment 3.

First, as shown in (a1) in FIG. 15, a pretreatment of specimen 50 is performed (specimen preparation step). For instance, an obtained specimen is dehydrated and embedded in paraffin. After that, the paraffin-embedded specimen is cut into a slice having a desired thickness of about several to several tens µm, and deparaffinized specimen 50 is disposed on the front surface of glass slide 20.

Next, as shown in (b1) in FIG. 15, specimen 50, together with glass slide 20, is immersed in a staining solution. As shown in (c1) in FIG. 15, specimen 50 is thereby stained.

Meanwhile, as shown in (a2) in FIG. 15, transparent oil 36A is dropped onto the light receiving surface of image sensor 10. The material of transparent oil 36A can be a nonvolatile oil, for example, an oil such as a Class III petroleum.

Next, as shown in (b2) in FIG. 15, after transparent oil 36A has been dropped onto the light receiving surface, transparent oil 36A is caused to uniformly spread on the light receiving surface by allowing a predetermined length of time to elapse or by performing spin coating or the like. That is, in (a2) and (b2) in FIG. 15, transparent oil layer 36 member is disposed on the light receiving surface of image sensor 10 such that the back surface of transparent oil layer 36 made of a water-repellent oil material seals the light receiving surface (transparent member disposing step).

Next, as shown in (d) in FIG. 15, the surface of glass slide 20 on which specimen 50 is disposed and the light receiving surface of image sensor 10 on which transparent oil layer 36 is disposed are superposed. That is, specimen 50 is disposed on the surface of transparent oil layer 36 (transparent member disposing step).

Through the step described above, as shown in (e) in FIG. 15, transparent oil layer 36, specimen 50, and glass slide 20 are stacked in this order, and prepared slide 61 that is sealed and insulated from the ambient air is formed.

Instead of the step of dropping transparent oil 36A onto the light receiving surface shown in (b2) in FIG. 15, transparent oil 36A may be dropped onto specimen 50 disposed on glass slide 20. By doing so, transparent oil 36A is uniformly spread on specimen 50 so as to cover specimen 50. Then, the surface of glass slide 20 on which specimen 50 and transparent oil 36A are disposed and the light receiving surface of image sensor 10 may be superposed.

Next, image sensor 10 and prepared slide 61 are fixed by being sandwiched between base member 40A and base member 40B. By doing so, image sensor 10 and specimen 50 are brought into close proximity to each other with only transparent oil layer 36 interposed therebetween, without being in direct contact with each other, and are not bonded. Accordingly, image sensor 10 and glass slide 20 on which specimen 50 is disposed are detachably fixed.

As described above, according to the electronic prepared slide assembly method of the present embodiment, because transparent oil layer 36 having the features described above is interposed between the light receiving surface of image sensor 10 and specimen 50, it is possible to prevent image sensor 10 from being damaged while maintaining the high imaging accuracy of image sensor 10.

Also, image sensor 10 and glass slide 20 having specimen 50 disposed thereon that have been once fixed can be separated from each other without causing damage to the light receiving surface of image sensor 10 by separating base member 40A and base member 40B from each other, and thus one image sensor 10 can be applied (re-used) to multiple specimens 50. Accordingly, it is possible to acquire data of observed specimens having a high level of image accuracy at a low cost.

The following aspect will be given as an example in which one image sensor 10 is applied (re-used) to multiple specimens 50.

First, after the step of assembling an electronic prepared slide described above, imaging is performed by using image sensor 10 and prepared slide 61 that have been integrated with base member 40A and base member 40B.

Next, base member 40A and base member 40B are detached from image sensor 10 and prepared slide 61. In this state, image sensor 10 and glass slide 20 on which specimen 50 is disposed are joined together with only transparent oil layer 36 interposed therebetween, and it is therefore possible to easily separate image sensor 10 and specimen 50 from each other. After imaging has been performed, an encapsulant is dropped onto specimen 50, and specimen 50 is sandwiched between glass slide 20 and a cover slip. Specimen 50 that has been imaged is thereby brought into a storable state. In the case of imaging stored specimen 50 again, the encapsulant on specimen 50 is dissolved and removed by using a solvent such as xylene, and then specimen 50 and glass slide 20 are superposed on image sensor 10 having transparent oil layer 36 applied thereto.

On the other hand, with respect to image sensor 10 that has been separated from glass slide 20 having specimen 50 disposed thereon, transparent oil 36A remains on the light receiving surface of image sensor 10, but it is unnecessary to perform cleaning. In this state, or in a state in which transparent oil 36A is dropped onto the light receiving surface, image sensor 10 is superposed on glass slide 20 on which a new specimen 50 is disposed. Then, imaging is performed by using electronic prepared slide 3 in which image sensor 10, new specimen 50 and glass slide 20 that are superposed are detachably integrated with base member 40A and base member 40B.

By repeating assembling, imaging, separation and storage as described above, it is possible to apply (re-use) one image sensor 10 to multiple specimens 50.

[9. Electronic Prepared Slide Assembly Set]

Electronic prepared slide 3 according to Embodiment 3 is an embodiment of a finished product in which prepared slide 61, image sensor 10, and base members 40A and 40B are assembled, but the present disclosure is not limited to the above embodiment, and also encompasses an electronic prepared slide assembly set that is an embodiment before prepared slide 61, image sensor 10, and the fixing member are assembled.

That is, an electronic prepared slide assembly set according to a variation of the present embodiment includes glass slide 20 for supporting specimen 50, transparent oil 36A for sandwiching specimen 50 together with glass slide 20, image sensor 10 for receiving light that has passed through specimen 50 via transparent oil layer 36, and base members 40A and 40B for detachably fixing glass slide 20 and image sensor 10.

By assembling the components of the electronic prepared slide assembly set described above, electronic prepared slide 3 according to Embodiment 3 is produced, and the same effects as those of electronic prepared slide 3 can be obtained.

An imaging system for electronic prepared slide 3 has the same configuration as the imaging system for electronic prepared slide 1 according to Embodiment 1, and thus a description thereof is omitted here.

OTHER EMBODIMENTS

The electronic prepared slide, the solid state imaging element, the electronic prepared slide assembly set, and the electronic prepared slide assembly method according to the present disclosure are not limited to Embodiments 1 to 3. The present disclosure also encompasses other embodiments implemented by any combination of constituent elements of the above embodiments, variations obtained by making various types of modifications that can be conceived by a person having ordinary skill in the art to the embodiments described above within the range that does not depart from the gist of the present disclosure, and various types of devices incorporating the electronic prepared slide or the solid state imaging element according to any one of the present embodiments.

For example, image sensor 10 according to the present disclosure is not limited to the photoelectric conversion film stacked image sensor including photoelectric conversion film 104, and may be a CCD image sensor, a CMOS image sensor that are described below, or other image sensors. The CCD image sensor and the CMOS image sensor may be either a front illuminated image sensor or a back illuminated image sensor.

Figure 16A:
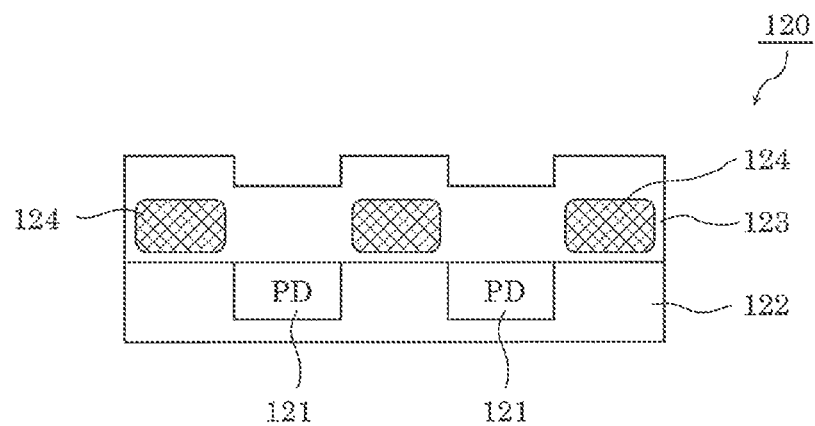
FIG. 16A is a cross-sectional view showing the structure of a CCD image sensor.

FIG. 16A is a cross-sectional view showing the structure of a CCD image sensor. As shown in FIG. 16A, CCD image sensor 120 includes substrate 122, insulating layer 123 provided on substrate 122, and interconnect 124 formed within insulating layer 123. A plurality of photodiodes 121 are formed in substrate 122. Also, on interconnect 124, a light shielding layer (not shown) is formed. In the diagram, transistors are not illustrated. Also, the cross-sectional structure near photodiodes in a front illuminated CMOS image sensor is the same as the cross-sectional structure near photodiodes in CCD image sensor 120 shown in FIG. 16A.

Figure 16B:
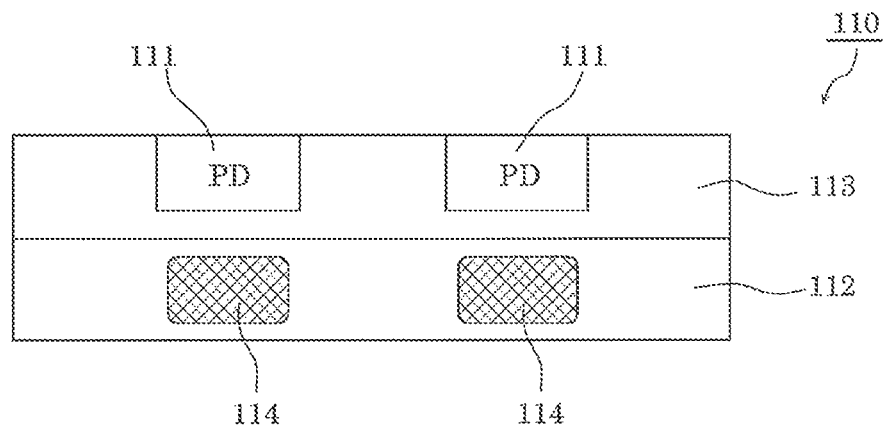
FIG. 16B is a cross-sectional view showing the structure of a back illuminated CMOS image sensor.

FIG. 16B is a cross-sectional view showing the structure of a back illuminated CMOS image sensor. As shown in FIG. 16B, back illuminated CMOS image sensor 110 includes substrate 113, insulating layer 112 provided below substrate 113, and interconnect 114 formed within insulating layer 112. A plurality of photodiodes 111 are formed in substrate 113. As shown in the diagram, back illuminated CMOS image sensor 110 has an advantage that, even if light is obliquely incident, the transmitted light is not blocked by interconnect 114. In order to reduce noise generated in substrate 113, a light shielding layer may be formed in a region of substrate 113 in which photodiodes 111 are not formed.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The electronic prepared slide, the solid state imaging element, the electronic prepared slide assembly set, and the electronic prepared slide assembly method according to the present disclosure can implement imaging with high image quality at a low cost, and thus are useful in, for example, examination of pathological specimens.

What is claimed is:

1. An electronic prepared slide, comprising:
    a solid state imaging element that has a light receiving surface and receives, on the light receiving surface, light that has passed through a specimen disposed above the light receiving surface;
    a transparent member that is removable and nonvolatile and is disposed on the light receiving surface to seal the light receiving surface, wherein the transparent member is a transparent film that seals the light receiving surface; and
    an encapsulating member that is volatile and is disposed on a surface of the transparent member that is on an opposite side to the light receiving surface of the solid state imaging element, the encapsulating member encapsulating the specimen disposed above the light receiving surface.

2. The electronic prepared slide according to claim 1, wherein a difference in refractive index between the transparent member and the encapsulating member is 0.2 or less.

3. The electronic prepared slide according to claim 1, wherein the transparent member is in contact with the encapsulating member without chemically reacting with the encapsulating member.

4. The electronic prepared slide according to claim 3, wherein the transparent member comprises a material that is insoluble in a dilution/dissolution agent for the encapsulating member.

5. The electronic prepared slide according to claim 4, wherein the transparent member comprises a material that is insoluble in a xylene or pinene compound-based solvent that is the dilution/dissolution agent.

6. The electronic prepared slide according to claim 1, wherein the transparent member comprises a water-repellent oil material.

7. The electronic prepared slide according to claim 6, wherein a space between the light receiving surface and the specimen is filled only with the transparent member.

8. The electronic prepared slide according to claim 1, further comprising:
    a transparent substrate that has a first main surface and a second main surface, the first main surface and the second main surface being on opposite sides of the transparent substrate; and
    a fixing member that fixes the transparent substrate and the solid state imaging element such that the transparent substrate and the solid state imaging element are detachable from each other,
        wherein the solid state imaging element receives light on the light receiving surface via the transparent member, the light being incident on the first main surface from the second main surface side and passing through the specimen.

9. The electronic prepared slide according to claim 8, wherein the fixing member includes:
    a first base member in which an electric interconnect that electrically connects a signal input terminal for transmitting an image signal generated by the solid state imaging element and an external connection terminal that outputs the image signal to outside the electronic prepared slide is formed; and
    a second base member that is provided with an opening for guiding incident light to the specimen, and
    the solid state imaging element, the transparent member, the specimen, and the transparent substrate are disposed in this order between the first base member and the second base member, and are fixed by one of the first base member and the second base member latching on the other.

10. An electronic prepared slide assembly method for assembling an electronic prepared slide in which a specimen and a solid state imaging element that images the specimen are fixedly disposed, the method comprising:

preparing the specimen;
disposing a transparent member between the specimen and a light receiving surface of the solid state imaging element so as to be in contact with the light receiving surface of the solid state imaging element, the transparent member being removable and nonvolatile;
detachably fixing the specimen and the solid state imaging element; and
disposing an encapsulating member to encapsulate the specimen during a period between the preparing of the specimen and the fixing of the specimen and the solid state imaging element,
wherein, in disposing the transparent member, a transparent film that is the transparent member is disposed between (i) the specimen and the encapsulating member and (ii) the light receiving surface of the solid state imaging element so as to be in contact with the light receiving surface of the solid state imaging element.

11. The electronic prepared slide assembly method according to claim 10, wherein in the preparing of the specimen, the specimen is disposed on a first main surface of a transparent substrate,
in the disposing of the encapsulating member, the encapsulating member is disposed on the first main surface of the transparent substrate so as to cover the specimen,
in the disposing of the transparent member, the transparent member is disposed on the first main surface of the transparent substrate such that the specimen and the encapsulating member are sandwiched between the transparent member and the transparent substrate, and
in the fixing of the specimen and the solid state imaging element, the transparent substrate and the solid state imaging element are detachably fixed such that the transparent member is sandwiched between the light receiving surface of the solid state imaging element and the specimen.

12. The electronic prepared slide assembly method according to claim 11,
wherein in the disposing of the transparent member, a transparent sheet that is a preform for the transparent film is brought into close contact with a portion of the first main surface and the encapsulating member while the transparent film is stretched in a plane direction of the transparent substrate, and thereby the transparent film having a thickness smaller than the transparent sheet is disposed on the first main surface.

13. The electronic prepared slide assembly method according to claim 10,
wherein in the disposing of the transparent member, the transparent film is disposed on the light receiving surface of the solid state imaging element such that the light receiving surface of the solid state imaging element is sealed by a back surface of the transparent film,
in the preparing of the specimen, the specimen is disposed on a front surface of the transparent film disposed on the light receiving surface of the solid state imaging element, and
in the disposing of the encapsulating member, the encapsulating member is disposed on the front surface of the transparent film so as to cover the specimen.

14. The electronic prepared slide assembly method according to claim 10,
wherein in the disposing of the transparent member, the transparent member is disposed on the light receiving surface of the solid state imaging element such that the light receiving surface of the solid state imaging element is sealed by a back surface of the transparent member comprising a water-repellent oil material, and the specimen is disposed on a front surface of the transparent member.

* * * * *